(12) United States Patent
Inbar et al.

(10) Patent No.: US 9,817,593 B1
(45) Date of Patent: Nov. 14, 2017

(54) BLOCK MANAGEMENT IN NON-VOLATILE MEMORY SYSTEM WITH NON-BLOCKING CONTROL SYNC SYSTEM

(71) Applicant: SanDisk Technologies LLC, Plano, TX (US)

(72) Inventors: Karin Inbar, Ramat-Hasharon (IL); Einat Lev, Rehovot (IL); Michael Yonin, Tel Aviv (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/207,212

(22) Filed: Jul. 11, 2016

(51) Int. Cl.
| | |
|---|---|
| G11C 11/34 | (2006.01) |
| G06F 3/06 | (2006.01) |
| G11C 16/10 | (2006.01) |
| G11C 14/00 | (2006.01) |
| G11C 16/26 | (2006.01) |

(52) U.S. Cl.
CPC ............ G06F 3/0619 (2013.01); G06F 3/065 (2013.01); G06F 3/0679 (2013.01); G11C 14/00 (2013.01); G11C 16/10 (2013.01); G11C 16/26 (2013.01)

(58) Field of Classification Search
None
See application file for complete search history.

(56) References Cited

U.S. PATENT DOCUMENTS

| | | |
|---|---|---|
| 5,043,940 A | 8/1991 | Harari |
| 5,070,032 A | 12/1991 | Yuan et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,367,484 A | 11/1994 | Alexander et al. |
| 5,404,485 A | 4/1995 | Ban |
| 5,473,765 A | 12/1995 | Gibbons et al. |
| 5,532,962 A | 7/1996 | Auclair et al. |
| 5,570,315 A | 10/1996 | Tanaka et al. |
| 5,661,053 A | 8/1997 | Yuan |
| 5,742,934 A | 4/1998 | Shinohara |
| 5,751,634 A | 5/1998 | Itoh |

(Continued)

FOREIGN PATENT DOCUMENTS

| | | |
|---|---|---|
| CN | 1243317 A | 2/2000 |
| CN | 1922580 A | 2/2007 |

(Continued)

*Primary Examiner* — Son Dinh
*Assistant Examiner* — Sultana Begum
(74) *Attorney, Agent, or Firm* — Foley & Lardner LLP

(57) ABSTRACT

In a non-volatile memory system, the controller maintains in its volatile memory two free block lists for the assignment of memory circuit blocks when writing user and system data. Copies of the free block lists are maintained in the non-volatile memory. While allocating blocks from a first of the free block lists, the controller can update a second of the free block lists as part of a control sync operation preparing control data stored in non-volatile memory. This allows the memory system to operate in a non-blocking manner during the control sync. Once the second free block lists is prepared and the control sync completed, the second block can subsequently be used for block allocations and a control sync operation can be done to update the first block.

21 Claims, 26 Drawing Sheets

(56) References Cited

U.S. PATENT DOCUMENTS

| | | |
|---|---|---|
| 5,768,192 A | 6/1998 | Eitan |
| 5,774,397 A | 6/1998 | Endoh et al. |
| 5,797,033 A | 8/1998 | Ecclesine |
| 5,798,968 A | 8/1998 | Lee et al. |
| 5,860,124 A | 1/1999 | Matthews et al. |
| 5,890,192 A | 3/1999 | Lee et al. |
| 5,903,495 A | 5/1999 | Takeuchi et al. |
| 5,906,000 A | 5/1999 | Abe et al. |
| 5,907,856 A | 5/1999 | Estakhri et al. |
| 5,909,449 A | 6/1999 | So et al. |
| 5,930,167 A | 7/1999 | Lee et al. |
| 5,933,368 A | 8/1999 | Ma et al. |
| 5,937,425 A | 8/1999 | Ban |
| 6,011,725 A | 1/2000 | Eitan |
| 6,034,897 A | 3/2000 | Estakhri et al. |
| 6,046,935 A | 4/2000 | Takeuchi et al. |
| 6,098,077 A | 8/2000 | Sassa |
| 6,125,435 A | 9/2000 | Estakhri et al. |
| 6,141,249 A | 10/2000 | Estakhri et al. |
| 6,157,991 A | 12/2000 | Arnon |
| 6,185,663 B1 | 2/2001 | Burke |
| 6,222,762 B1 | 4/2001 | Guterman et al. |
| 6,226,728 B1 | 5/2001 | See et al. |
| 6,272,610 B1 | 8/2001 | Katayama et al. |
| 6,304,980 B1 | 10/2001 | Beardsley et al. |
| 6,377,500 B1 | 4/2002 | Fujimoto et al. |
| 6,401,160 B1 | 6/2002 | See et al. |
| 6,421,279 B1 | 7/2002 | Tobita et al. |
| 6,426,893 B1 | 7/2002 | Conley et al. |
| 6,446,249 B1 | 9/2002 | Wang et al. |
| 6,456,528 B1 | 9/2002 | Chen |
| 6,490,649 B2 | 12/2002 | Sinclair |
| 6,522,580 B2 | 2/2003 | Chen et al. |
| 6,544,844 B2 | 4/2003 | Chang et al. |
| 6,563,734 B2 | 5/2003 | Taki |
| 6,567,307 B1 | 5/2003 | Estakhri |
| 6,571,261 B1 | 5/2003 | Wang-Knop et al. |
| 6,591,328 B1 | 7/2003 | Iida et al. |
| 6,591,330 B2 | 7/2003 | Lasser |
| 6,598,174 B1 | 7/2003 | Parks et al. |
| 6,643,170 B2 | 11/2003 | Huang et al. |
| 6,697,957 B1 | 2/2004 | Wang et al. |
| 6,725,321 B1 | 4/2004 | Sinclair et al. |
| 6,763,424 B2 | 7/2004 | Conley |
| 6,826,651 B2 | 11/2004 | Michael et al. |
| 6,871,259 B2 | 3/2005 | Hagiwara et al. |
| 6,895,464 B2 | 5/2005 | Chow et al. |
| 6,898,662 B2 | 5/2005 | Gorobets |
| 7,139,864 B2 | 11/2006 | Bennett et al. |
| 7,177,184 B2 | 2/2007 | Chen |
| 7,315,916 B2 | 1/2008 | Bennett et al. |
| 7,913,061 B2 | 3/2011 | Gorobets et al. |
| 7,945,759 B2 | 5/2011 | Gorobets |
| 8,051,257 B2 | 11/2011 | Gorobets et al. |
| 8,103,841 B2 | 1/2012 | Sinclair et al. |
| 8,793,429 B1 * | 7/2014 | Call .................. G06F 12/0246 711/103 |
| 2001/0042882 A1 | 11/2001 | Chang et al. |
| 2002/0099904 A1 | 7/2002 | Conley |
| 2002/0136054 A1 | 9/2002 | Blodgett |
| 2002/0184436 A1 | 12/2002 | Kim et al. |
| 2002/0199058 A1 | 12/2002 | Ofek |
| 2003/0053334 A1 | 3/2003 | Chen |
| 2003/0065899 A1 | 4/2003 | Gorobets |
| 2003/0076709 A1 | 4/2003 | Huang et al. |
| 2003/0109093 A1 | 6/2003 | Harari et al. |
| 2003/0110343 A1 | 6/2003 | Hagiwara et al. |
| 2003/0115433 A1 | 6/2003 | Kodama |
| 2003/0191916 A1 | 10/2003 | McBrearty et al. |
| 2004/0039889 A1 | 2/2004 | Elder et al. |
| 2004/0088480 A1 | 5/2004 | Fox et al. |
| 2004/0103241 A1 | 5/2004 | Chang et al. |
| 2005/0132129 A1 | 6/2005 | Venkiteswaran |
| 2005/0141312 A1 | 6/2005 | Sinclair et al. |
| 2005/0141313 A1 | 6/2005 | Gorobets et al. |
| 2005/0144357 A1 | 6/2005 | Sinclair |
| 2005/0144358 A1 | 6/2005 | Conley et al. |
| 2005/0144360 A1 | 6/2005 | Bennett et al. |
| 2005/0144363 A1 | 6/2005 | Sinclair |
| 2005/0144365 A1 | 6/2005 | Gorobets et al. |
| 2005/0144367 A1 | 6/2005 | Sinclair |
| 2005/0166087 A1 | 7/2005 | Gorobets |
| 2007/0061545 A1 | 3/2007 | Kuhne |
| 2009/0019217 A1 | 1/2009 | Gorobets et al. |
| 2009/0019218 A1 | 1/2009 | Sinclair et al. |
| 2009/0037651 A1 | 2/2009 | Gorobets |
| 2010/0262799 A1 * | 10/2010 | Lasser .................. G06F 12/0246 711/162 |
| 2011/0219174 A1 | 9/2011 | Gorobets |
| 2012/0191927 A1 | 7/2012 | Gorobets et al. |
| 2014/0006689 A1 * | 1/2014 | Hashimoto ......... G06F 12/0246 711/103 |
| 2015/0067415 A1 * | 3/2015 | Miyamoto ............ G06F 11/073 714/704 |
| 2016/0188455 A1 * | 6/2016 | Patel .................... G06F 12/0246 711/154 |
| 2017/0024137 A1 * | 1/2017 | Kanno .................. G06F 3/0604 |

FOREIGN PATENT DOCUMENTS

| | | |
|---|---|---|
| EP | 887732 A1 | 12/1998 |
| EP | 0977121 A2 | 2/2000 |
| EP | 1424631 A1 | 6/2004 |
| EP | 1702338 A2 | 9/2006 |
| EP | 1704484 A2 | 9/2006 |
| JP | H05046494 | 2/1993 |
| JP | H11073379 | 3/1999 |
| JP | 2001357683 A | 12/2001 |
| JP | 2002366423 A | 12/2002 |
| JP | 2003177974 A | 6/2003 |
| JP | 2004252746 A | 9/2004 |
| JP | 2005503640 A | 2/2005 |
| JP | 2007534048 A | 11/2007 |
| JP | 5314019 B2 | 10/2013 |
| TW | 543200 B | 7/2003 |
| TW | 559707 B | 11/2003 |
| TW | 561340 B | 11/2003 |
| TW | 561411 B | 11/2003 |
| WO | 0049488 A1 | 8/2000 |
| WO | 02058074 A2 | 7/2002 |
| WO | 03027828 A1 | 4/2003 |
| WO | 03029951 A2 | 4/2003 |
| WO | 2004040457 A1 | 5/2004 |
| WO | 2004040458 A1 | 5/2004 |
| WO | 2004040459 A1 | 5/2004 |
| WO | 2004040578 A2 | 5/2004 |
| WO | 2005041046 A2 | 5/2005 |
| WO | 2005066792 A2 | 7/2005 |
| WO | 2005066793 A2 | 7/2005 |
| WO | 2005066964 A2 | 7/2005 |
| WO | 2005066970 A2 | 7/2005 |
| WO | 2005066972 A1 | 7/2005 |

* cited by examiner

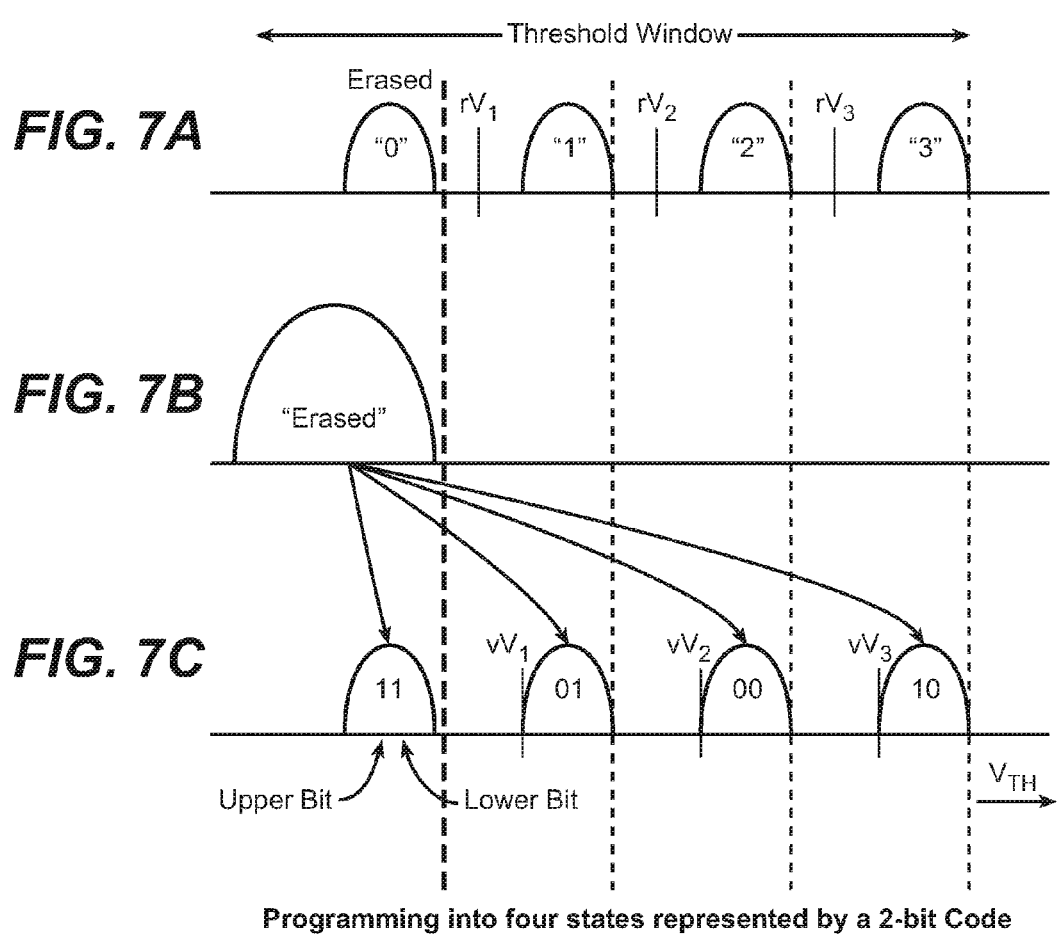

Lower Page Read (2-bit Code)

Upper Page Read (2-bit Code)

CS Preparation (RAM)

FBL #2: Block ID1, Block ID12, Block ID17, ....., Block ID101, Block ID107

FBL #3: Block ID1, Block ~~ID12~~, Block ID15, Block ID17, ....., Block ID85, Block ID101, Block ID107

*FIG. 20A*

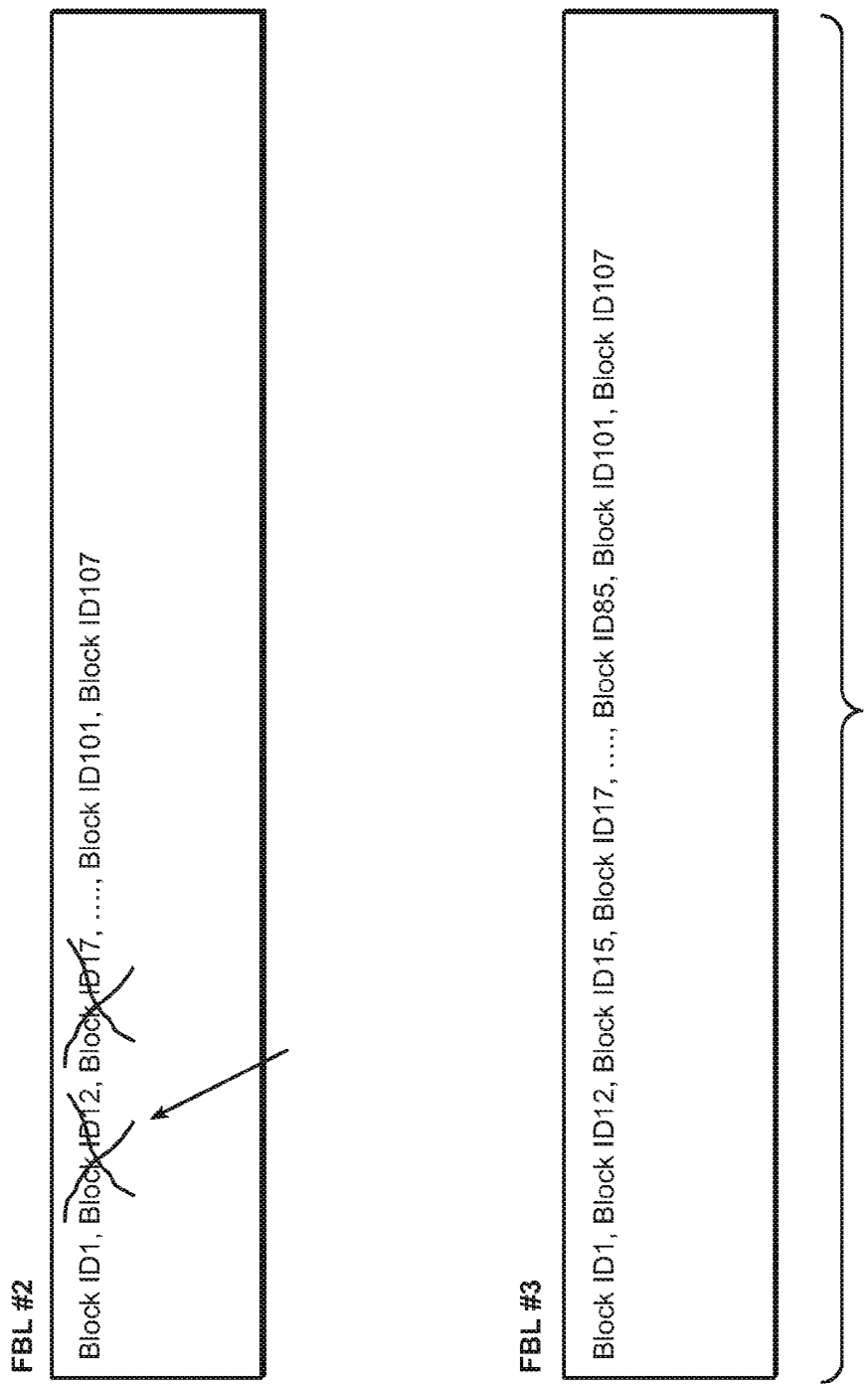

Mount After UGSD Before CS Completion

FBL #1: Block ID1, Block ID12, Block ID17, ....., Block ID101

FBL #2: Block ID1, Block ID17, ....., Block ID101, Block ID107

*FIG. 20D*

Mount After UGSD After CS Completion

FBL #2: Block ID1, Block ID12, Block ID17, ....., Block ID101, Block ID107

FBL #3: Block ID1, Block ID12, Block ID15, Block ID17, ....., Block ID85, Block ID101, Block ID107

*FIG. 20E*

BLOCK MANAGEMENT IN NON-VOLATILE MEMORY SYSTEM WITH NON-BLOCKING CONTROL SYNC SYSTEM

BACKGROUND

The following relates to the operation of re-programmable non-volatile memory systems, such as semiconductor flash memory, and the management of such systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

Non-volatile memory storage devices typically include a controller portion and a memory section and used a use logical-to-physical (L2P) mapping and use management tables for dynamic mapping. The logical-to physical mapping is performed by the controller and associates a physical address on the memory section where data is stored with a logical address by which a host identifies the data. In a standard arrangement, the management tables are stored in the non-volatile memory, but in order to provide high performance, management table copies are maintained also in the controller RAM, typically a DRAM. As the controller updates these tables during memory operations, the updated tables stored in the non-volatile device from time to time for synchronization, in an operation called Control Sync (CS).

If the system experiences an ungraceful shutdown (UGSD), such as losing power, any information updates made since the last control sync is lost, as this information was only held in volatile control memory. To avoid this problem, the system can operate in a blocking manner, where the flash controller does not send read/write commands to the flash dies, allowing them to complete their workload. Only after the workload is completed, confirmed and the control data is updated in the log are a new set of read/write commands sent. As the new block allocation will be performed according to the new log, data to control info coherency can be maintained, but at a loss of system performance due to the blocking.

SUMMARY

In a method of operating a non-volatile memory system, data is stored in a non-volatile memory circuit having a plurality of non-volatile memory cells formed as a plurality of multi-cell blocks and a controller manages the storage of data on the memory circuit. The managing includes maintaining in volatile memory of two or more free block lists, the block lists being formed of blocks available for the writing of data, and maintaining copies of the free block lists in the non-volatile memory. Blocks are allocated from a first of the free block lists, and, while allocating blocks from the first free block list, performing a synchronizing operation is performed for a second of the free block lists. The synchronizing operation includes updating the second free block list and preparing control data related to the updating of the second free block list.

In other aspects, a controller for a non-volatile memory system includes a volatile memory and logic circuitry configured to manage the storage of data on a non-volatile memory circuit having a plurality of non-volatile memory cells formed as a plurality of multi-cell blocks. Managing the storage of data on the non-volatile memory circuit includes: maintaining in the volatile memory of two or more free block lists, the block lists being formed of blocks available for the writing of data, and maintaining copies of the free block lists in the non-volatile memory. Blocks are allocated from a first of the free block lists, and, while allocating blocks from the first free block list, performing a synchronizing operation is performed for a second of the free block lists. The synchronizing operation includes updating the second free block list and preparing control data related to the updating of the second free block list.

In further aspects, a non-volatile memory system includes a non-volatile memory circuit having a plurality of non-volatile memory cells formed as a plurality of multi-cell blocks and a controller. The controller includes a volatile memory and logic circuitry configured to manage the storage of data on the non-volatile memory circuit. Managing the storage of data on the non-volatile memory circuit includes: maintaining in the volatile memory of two or more free block lists, the block lists being formed of blocks available for the writing of data, and maintaining copies of the free block lists in the non-volatile memory. Blocks are allocated from a first of the free block lists, and, while allocating blocks from the first free block list, performing a synchronizing operation is performed for a second of the free block lists. The synchronizing operation includes updating the second free block list and preparing control data related to the updating of the second free block list.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 7A-7C illustrate an example of programming a population of memory cells.

FIGS. 20A-E give examples of free block list content in various saturations.

DETAILED DESCRIPTION

Memory System

Figure 1:
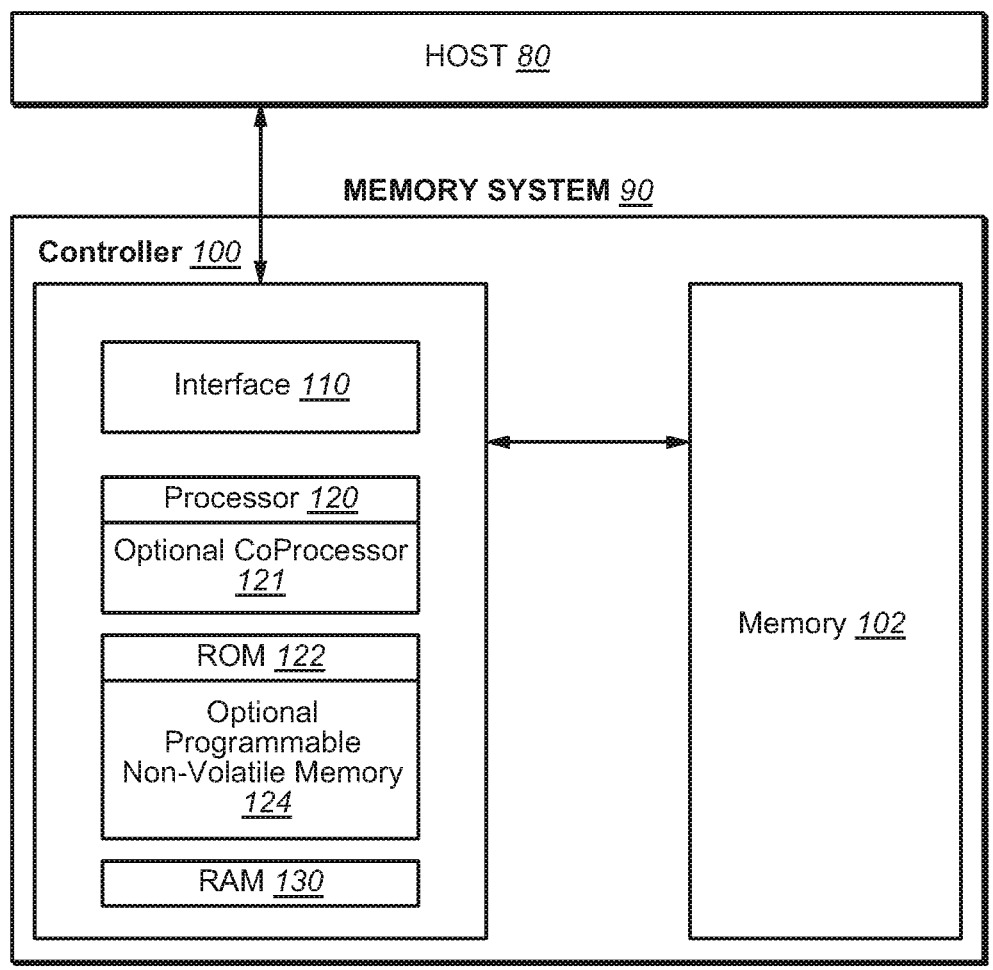
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
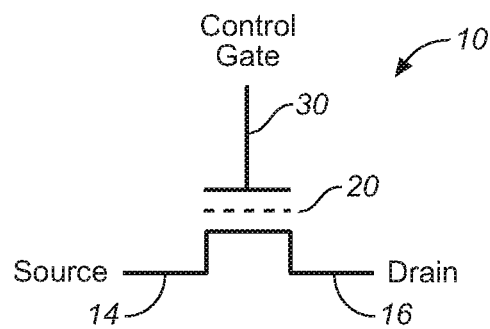
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
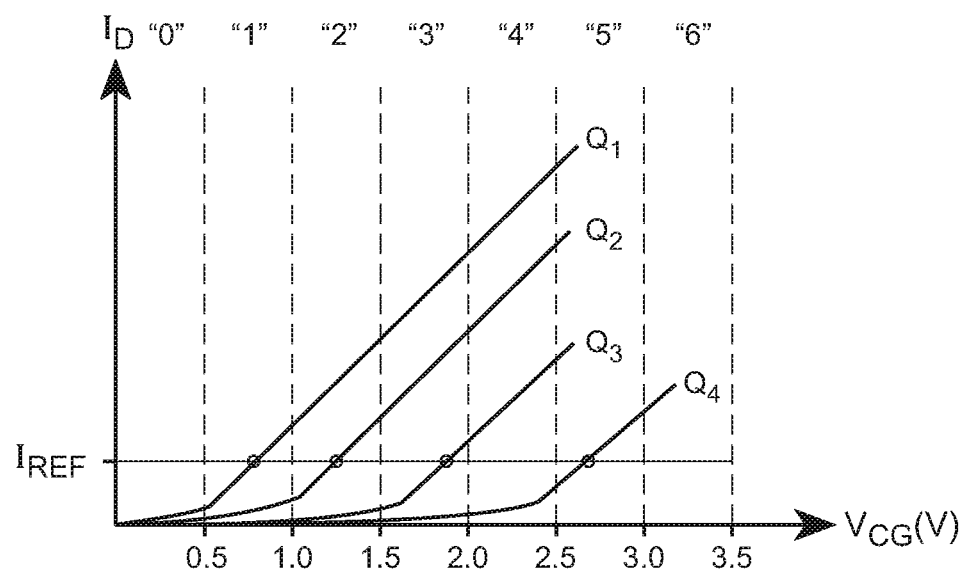
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
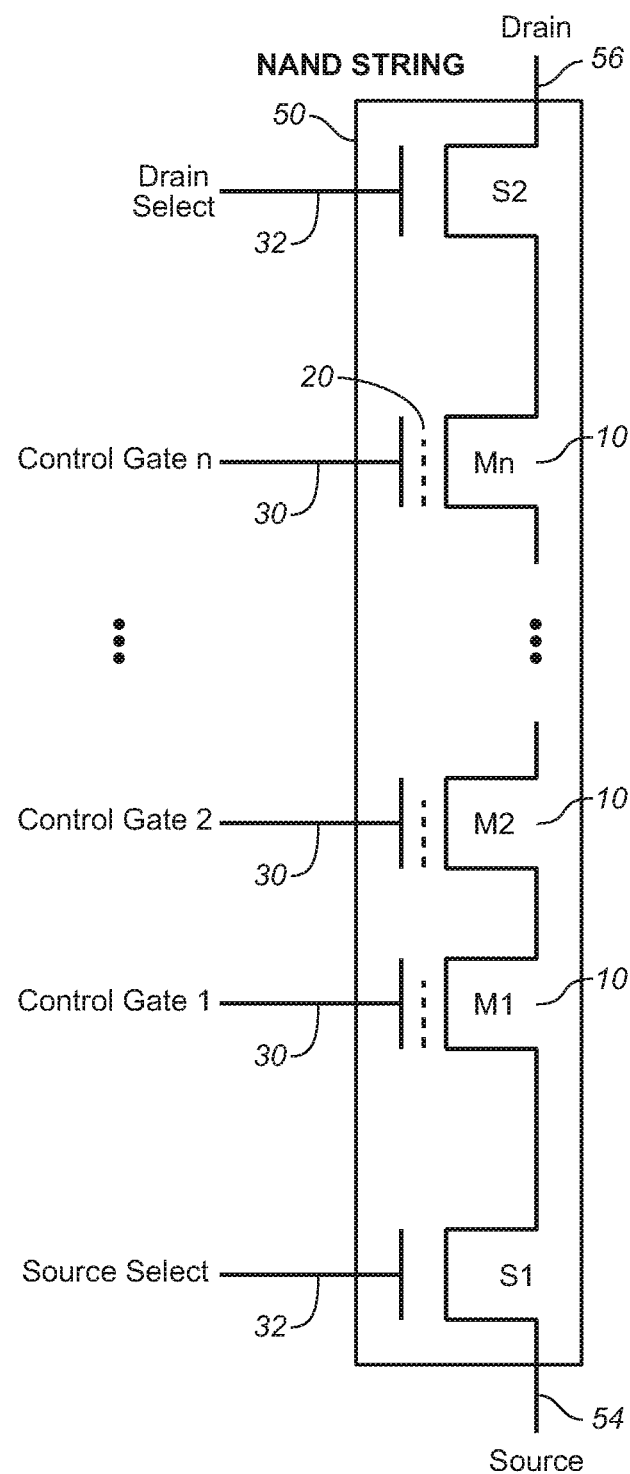
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
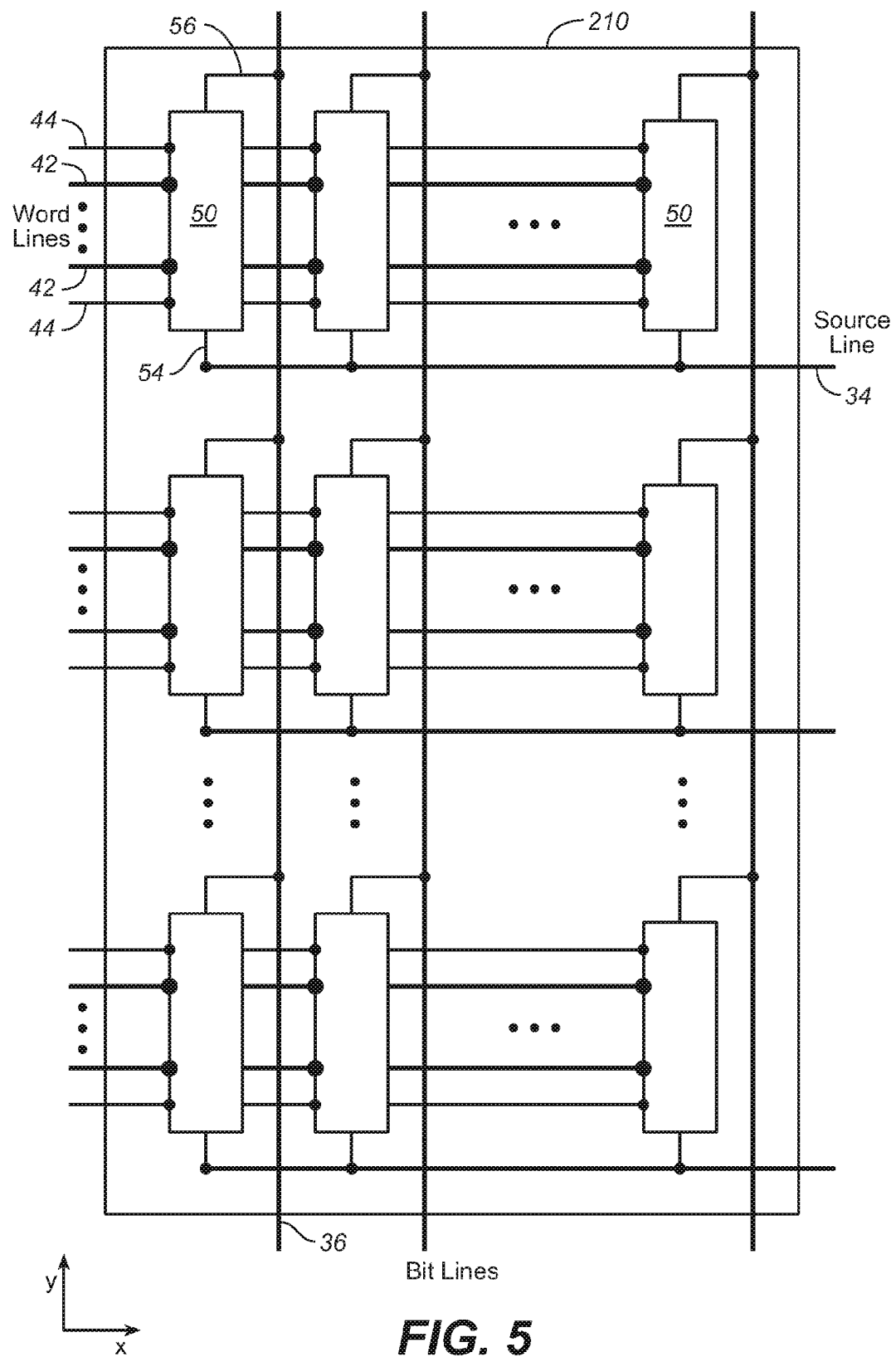
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
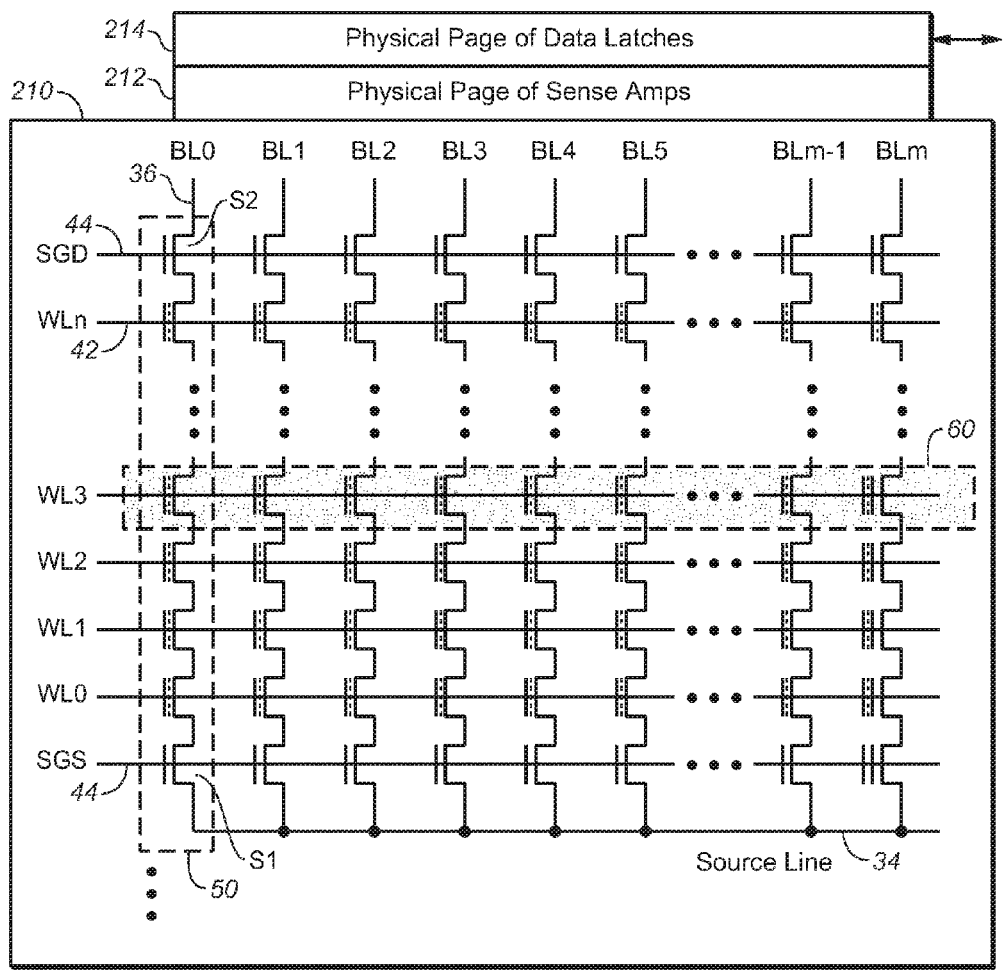
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into one of the three zones demarcated by verify levels vV1, vV2 and vV3. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7D:
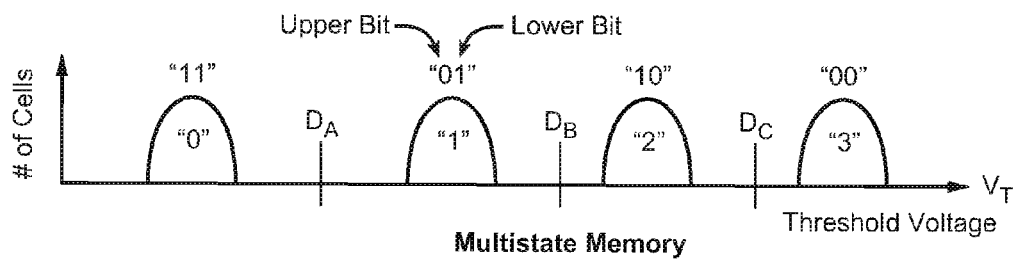
FIGS. 7D-7H illustrate the programming and reading of the 4-state memory encoded with a given 2-bit code.

FIGS. 7D-7H illustrate the programming and reading of the 4-state memory encoded with a given 2-bit code. FIG. 7D illustrates threshold voltage distributions of the 4-state memory array when each memory cell stores two bits of data using the 2-bit code.

Figure 7E:
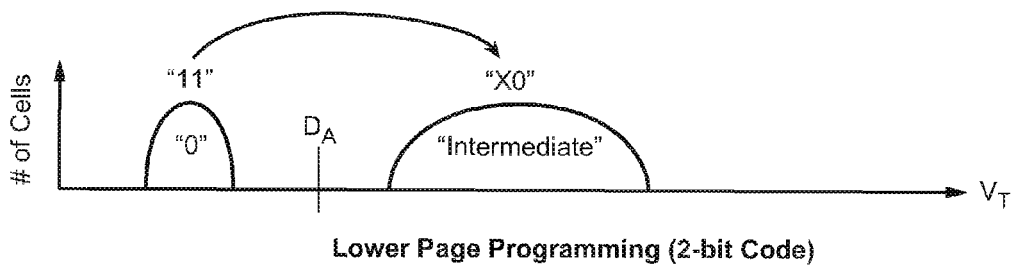

FIG. 7E illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than D.

Figure 7F:
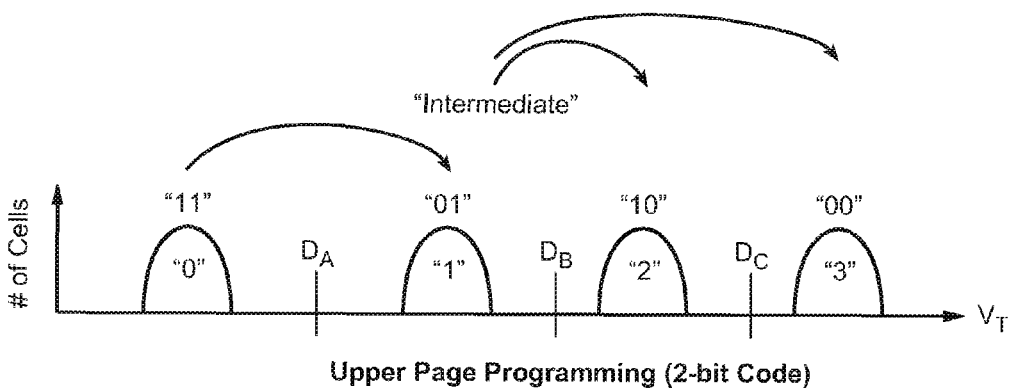

FIG. 7F illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7G:
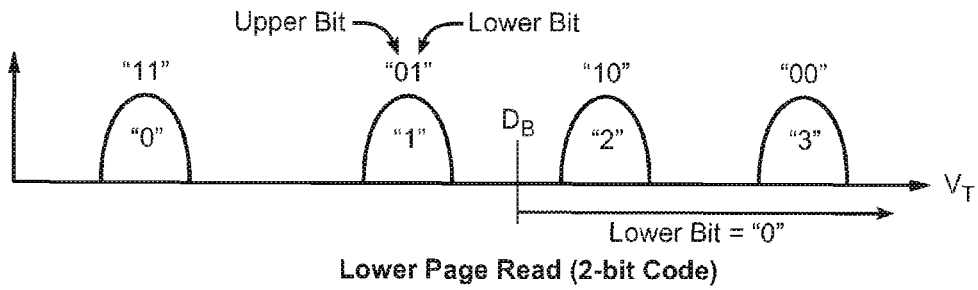

FIG. 7G illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7H:
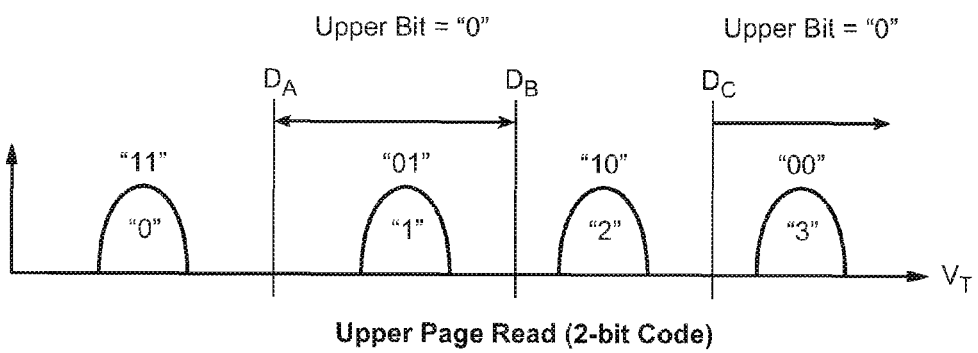

FIG. 7H illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Foggy-Fine Programming

Figure 7I:
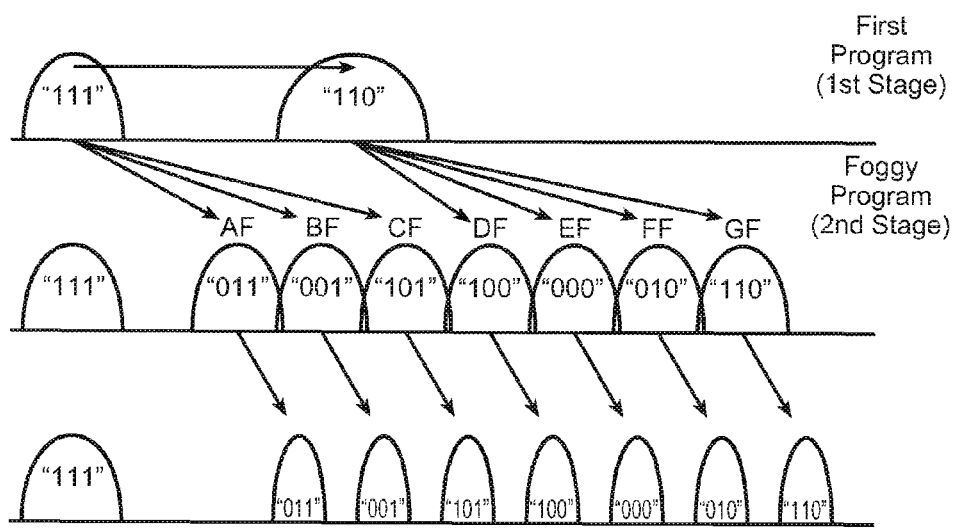
FIG. 7I illustrates a foggy-fine programming for an 8-state memory encoded with a given 3-bit code.

Another variation on multi-state programming employs a foggy-fine algorithm, as is illustrated in FIG. 7I for a 3-bit memory example. As shown there, this another multi-phase programming operation. A first programming operation is performed as shown in the top line, followed the foggy programming stage. The foggy phase is a full 3-bit programming operation from the first phase using all eight of the final states. At the end of the foggy, though, the data in these states is not yet fully resolved into well defined distributions for each of the 8 states (hence, the "foggy" name) and is not readily extractable.

As each cell is, however, programmed to near its eventual target state, the sort of neighboring cell to cell couplings, or "Yupin" effect, described in U.S. Pat. No. 6,870,768 are presenting most of their effect. Because of this, when the fine program phase (shown on the bottom line) is executed, these couplings have largely been factored in to this final phase so the cell distributions are more accurately resolved to their target ranges.

Binary and MLC Memory Partitioning

FIG. 6 and FIGS. 7A-I illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIGS. 7A-I provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIGS. 7A-C above is designed to minimize program disturb from cells along the same word line. As can be seen from FIG. 7D, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
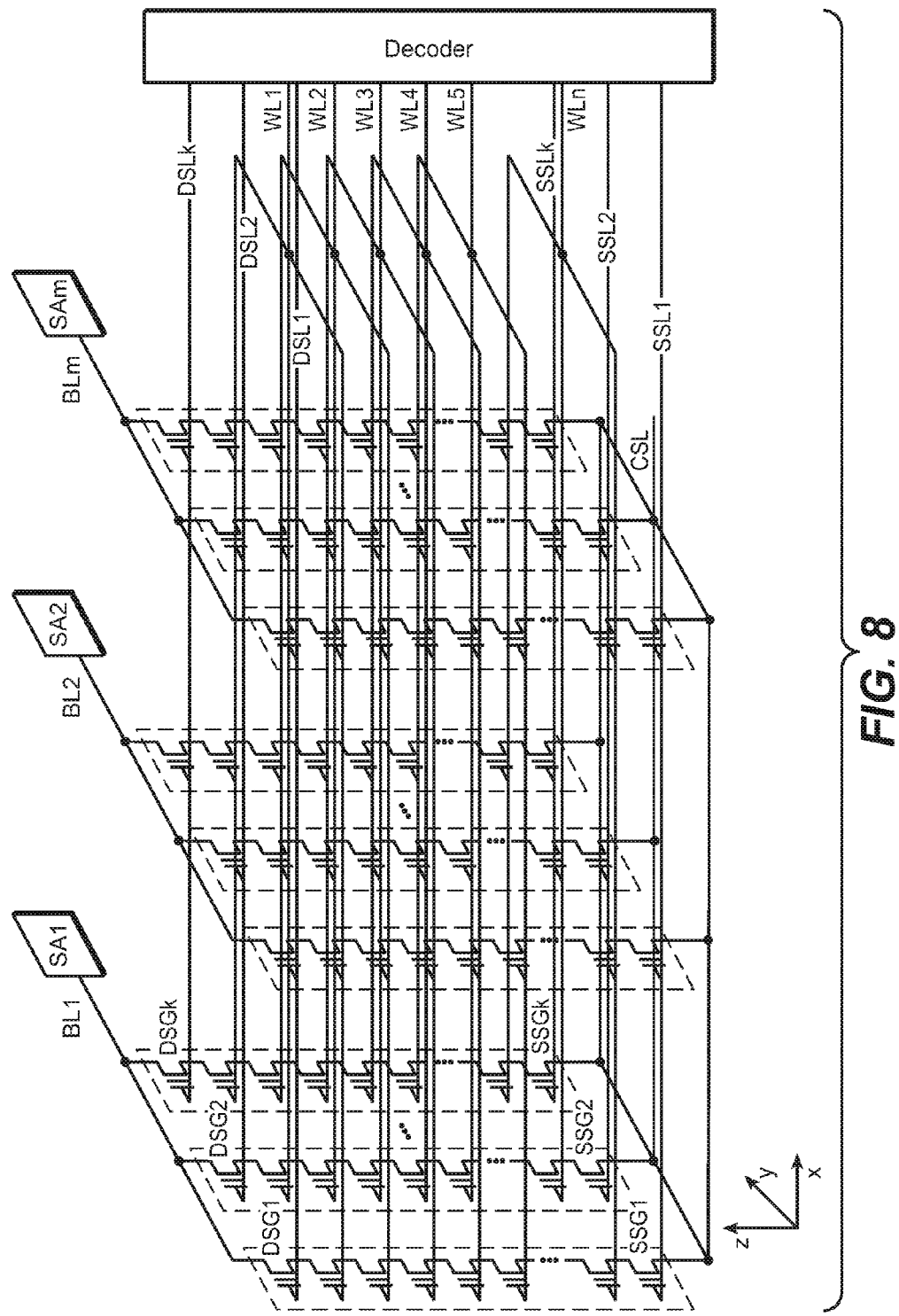
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
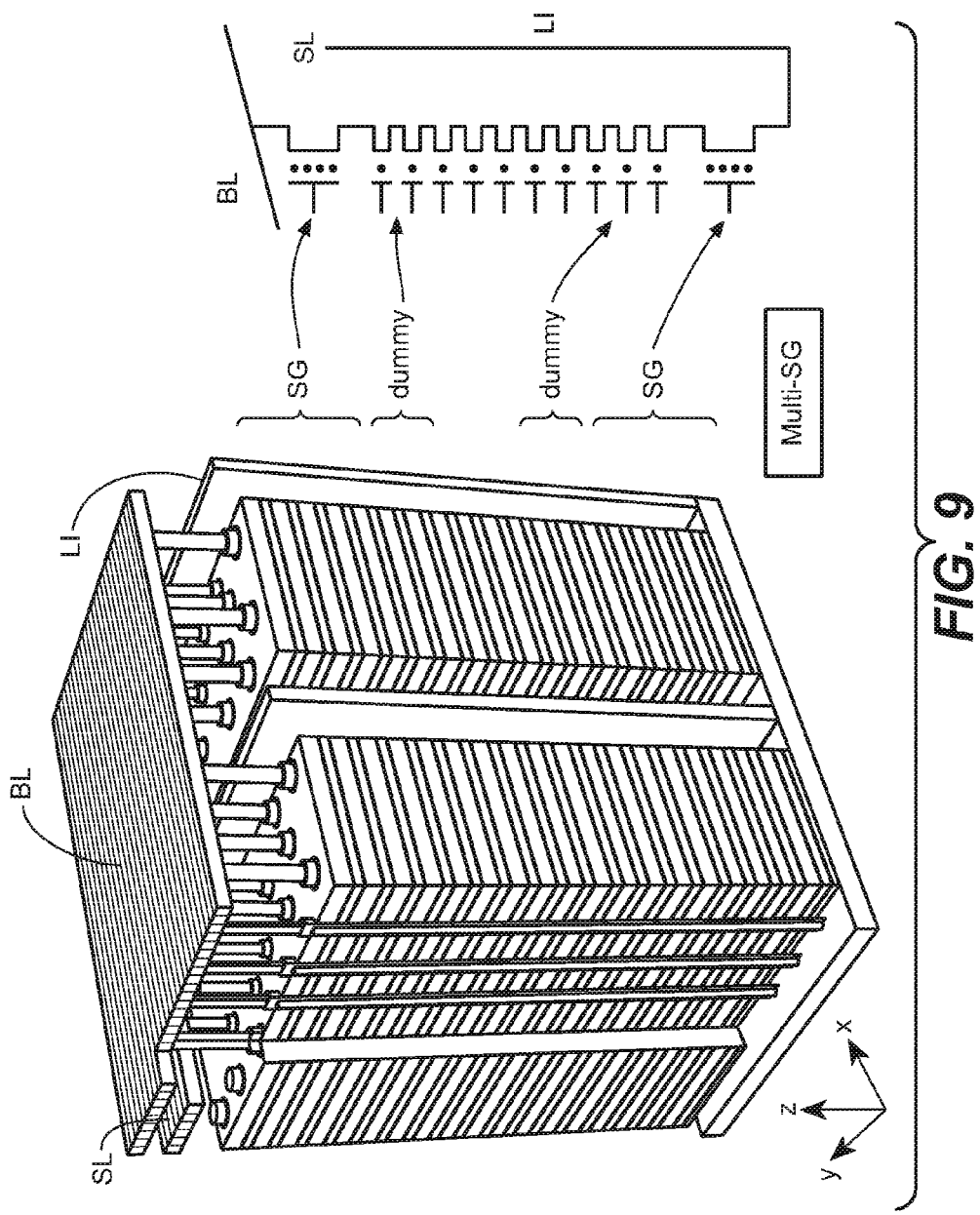
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series, making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
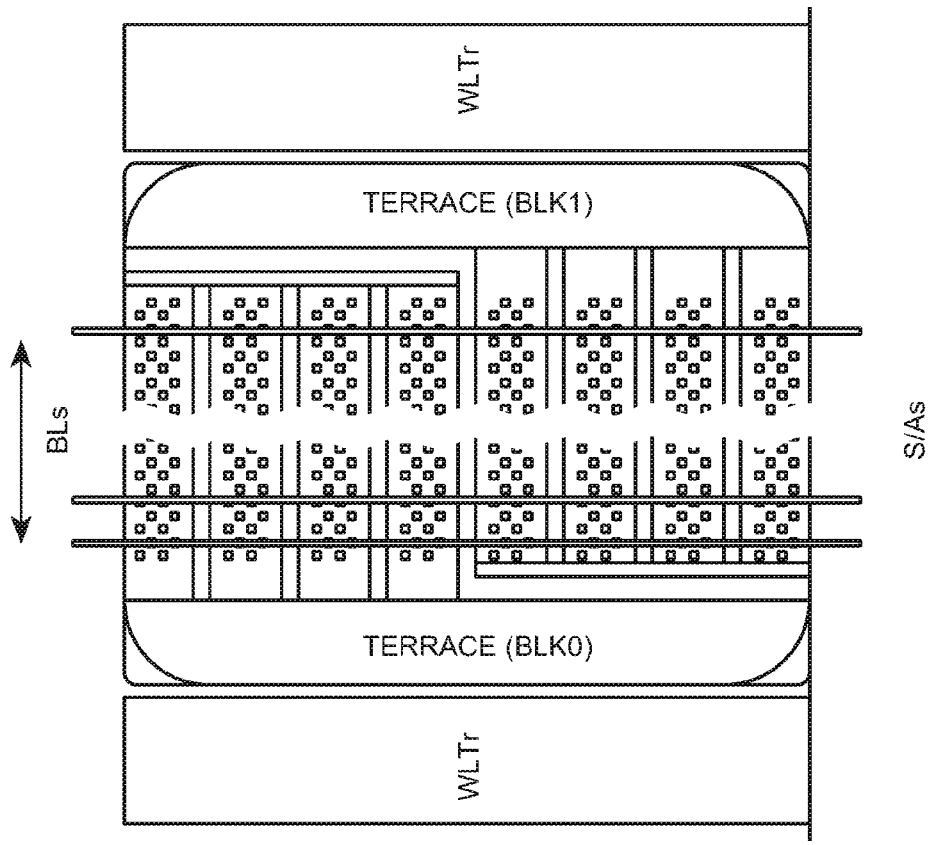

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
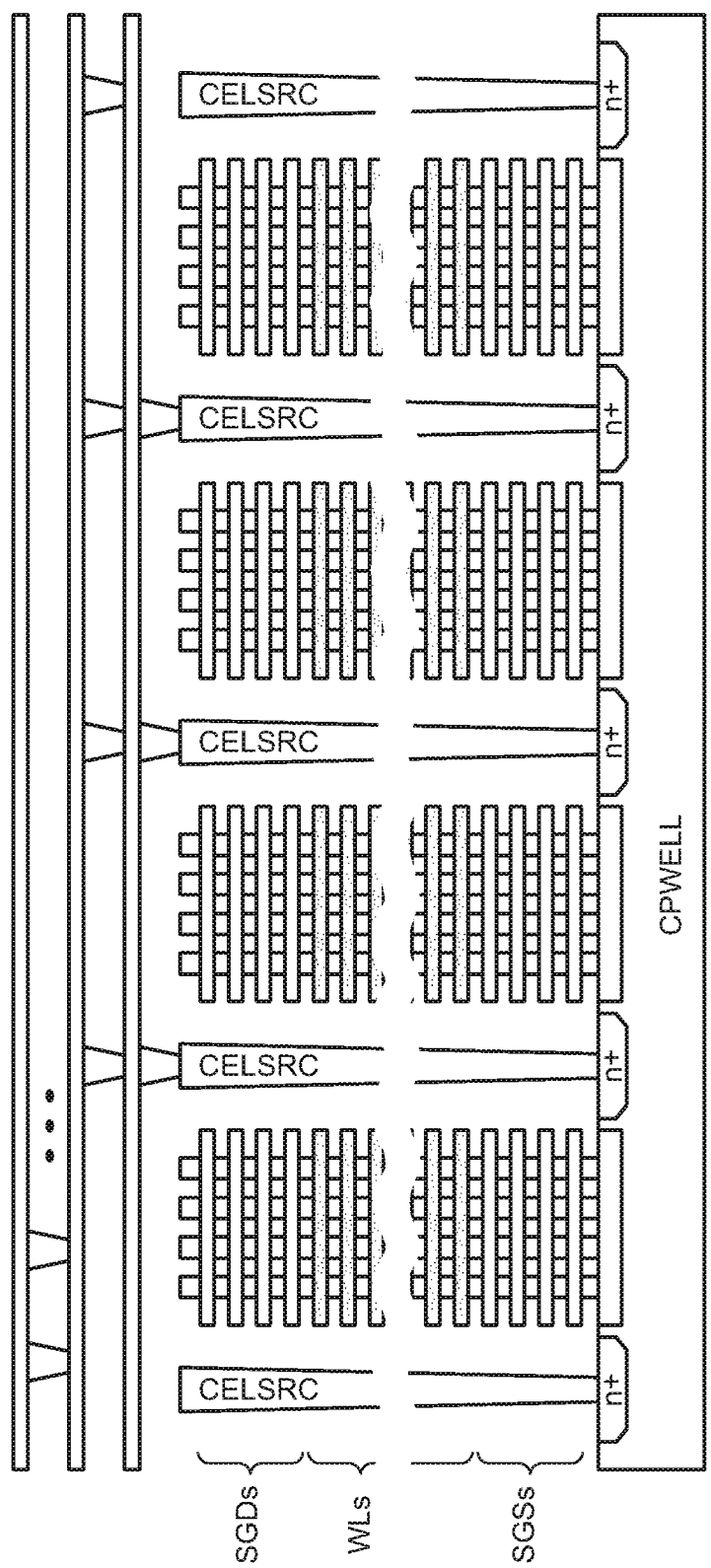

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
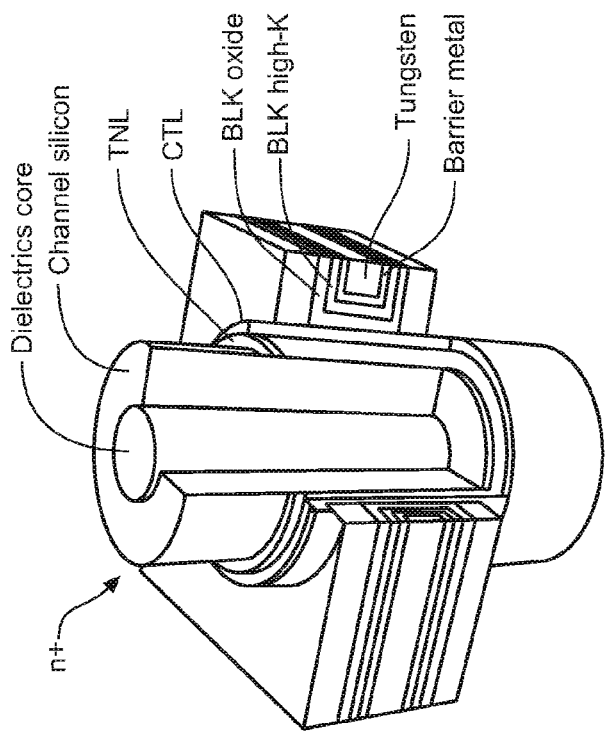

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Logical and Physical Block Structures

Figure 13:
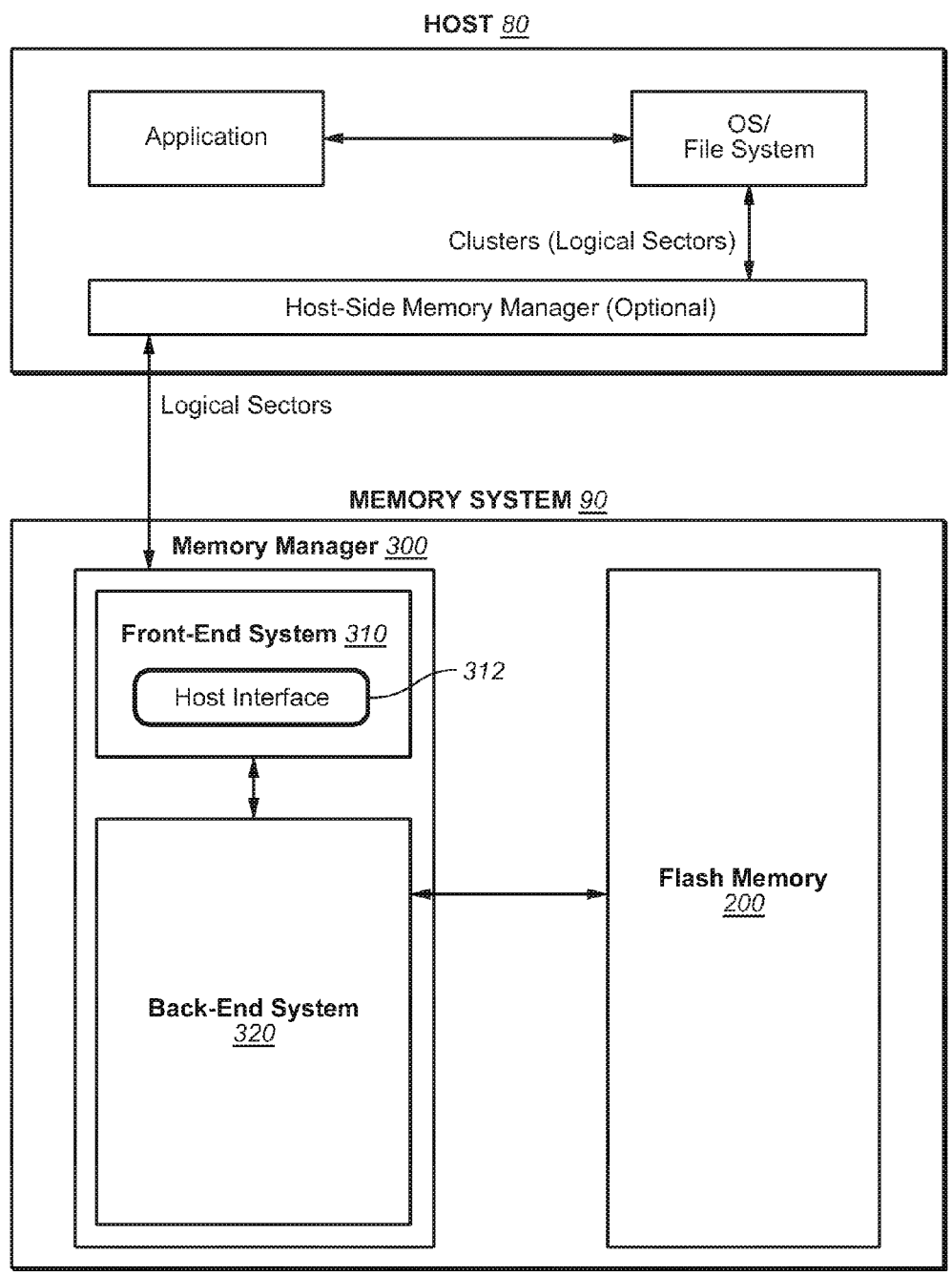
FIG. 13 illustrates the memory being managed by a memory manager with is a software component that resides in the controller.

FIG. 13 illustrates the memory being managed by a memory manager which is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 14:
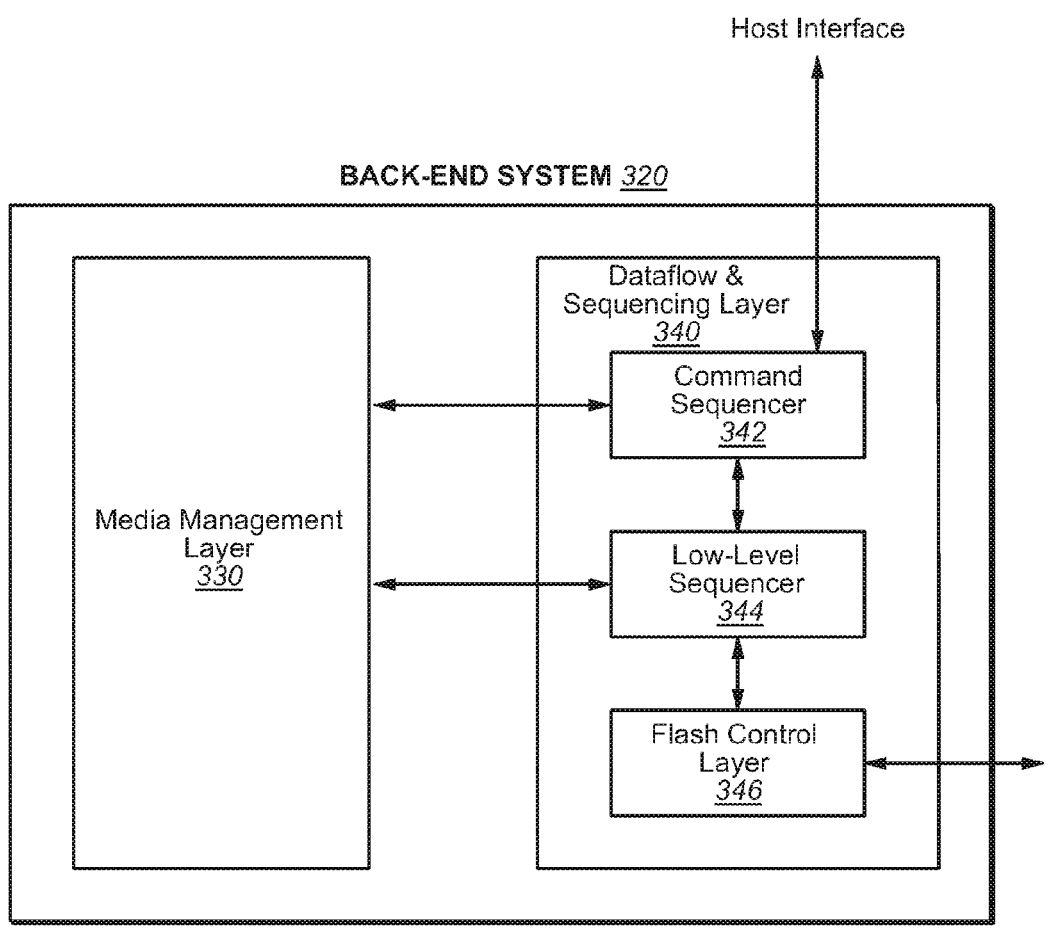
FIG. 14 illustrates the software modules of the back-end system.

FIG. 14 illustrates the software modules of the back-end system. The Back-End System mainly comprises two functional modules: a Media Management Layer 330 and a Dataflow and Sequencing Layer 340.

The dataflow and sequencing layer 340 is responsible for the sequencing and transfer of sectors of data between a front-end system and a flash memory. This layer includes a command sequencer 342, a low-level sequencer 344 and a flash Control layer 346.

The memory manager 300 is preferably implemented in the controller 100. It translates logical addresses received from the host into physical addresses within the memory array, where the data are actually stored, and then keeps track of these address translations.

Figure 15A:
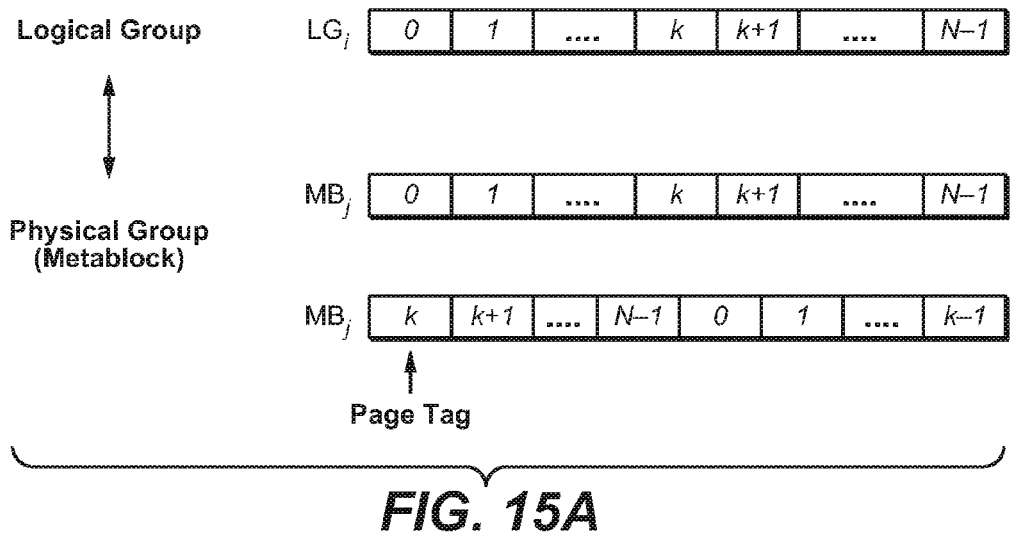
FIG. 15A illustrates schematically the mapping between a logical group and a metablock.

FIG. 15A illustrates schematically the logical to physical mapping in a metablock level arrangement, where the mapping is between a logical group and a metablock. A similar logical to physical mapping is used at the block level or other corresponding level based on the embodiment. The metablock of the physical memory has N physical sectors for storing N logical sectors of data of a logical group. FIG. 15A at top shows the data from a logical group $LG_i$, where the logical sectors are in contiguous logical order 0, 1, . . . , N−1. FIG. 15A in the middle row shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 15A in the bottom row, the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 15B:
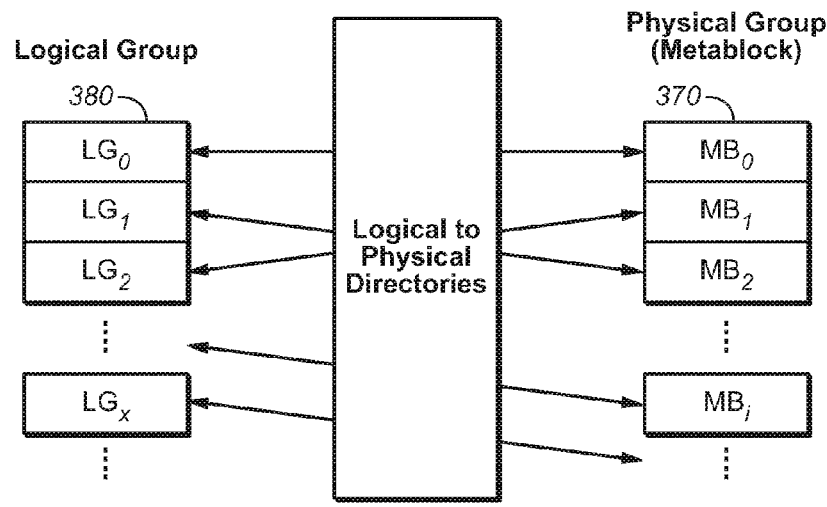
FIG. 15B illustrates schematically the mapping between logical groups and metablocks.

FIG. 15B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

Block Management in Non-Blocking Control Sync (CS) System

For storage devices use logical-to-physical (L2P) mapping and use management tables for dynamic mapping, the management tables are stored in the flash memory, but in order to provide high performance management table copies are also maintained in the controller RAM, typically a DRAM. The updated tables are stored in the memory section from time to time for synchronization in a Control Sync (CS) operation, involving the sub-operations of preparing for the CS, submitting a request to write a "log" of the operation, and receiving confirmation that the entire "log" was written successfully.

Figure 16:
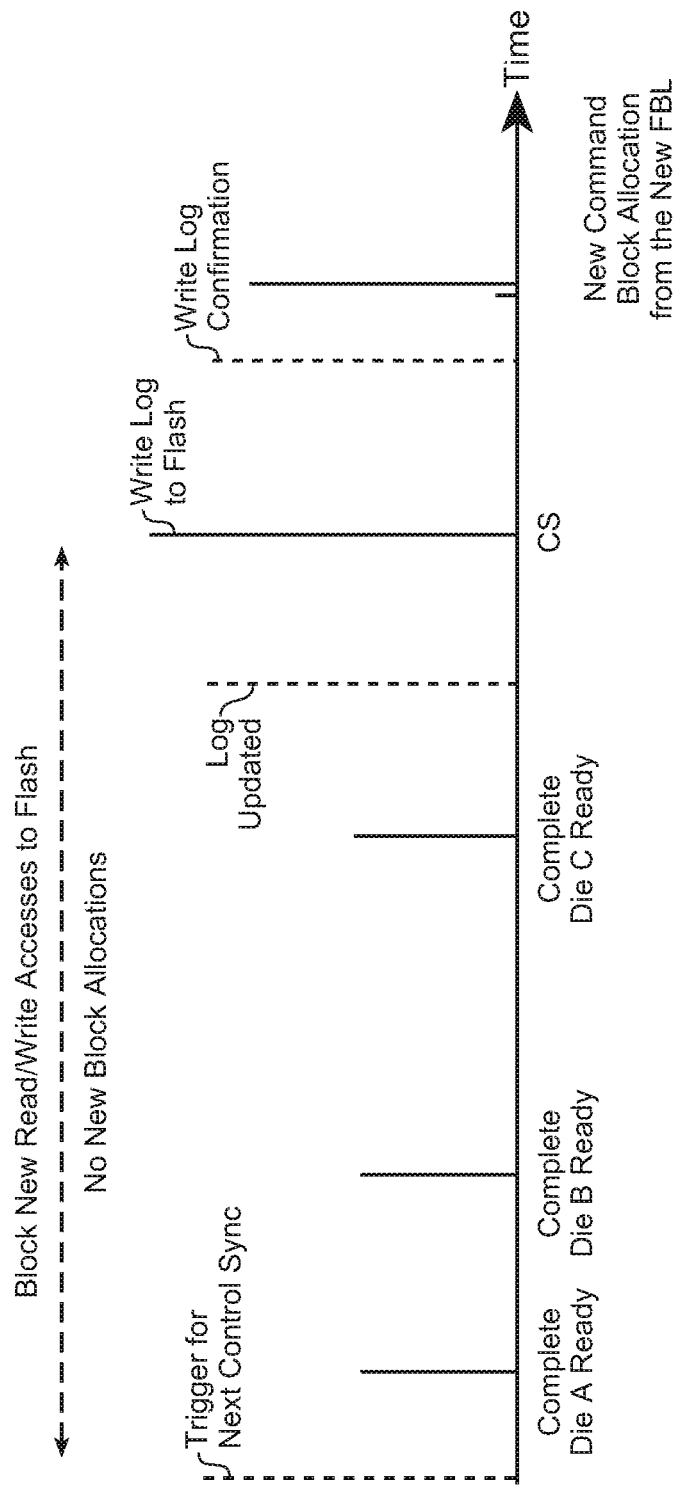
FIG. 16 illustrates the operation of a memory system in which no new blocks are allocated during a control synchronization.

When the control sync operations are performed in a blocking manner, the controller does not send read/write commands to the non-volatile memory dies, allowing them to complete their workload. Only after the workload is completed, confirmed and the control data is updated in the log in the controller's RAM, a control sync of the log is performed. FIG. 16 schematically represents such a blocking control sync operation, where any new read or write operations are blocked until the previously allocated operations in dies A, B, and C are complete and a ready signal is returned. Once the controller's log is updated, written to flash and confirmed, new block allocations can be performed according to the new log and data to control info coherency will be maintained.

Although the blocking arrangement allows for the memory system to maintain coherency of the memory system's logical to physical assignments, the blocking of operations affects performance. This section presents techniques whereby the controller can allocate new blocks and maintain data to control information coherency in a non-blocking control sync system by using two free block lists prepared with different timings. More specifically, block allocation is performed from a first free block list (FBL) that the controller compiles of available blocks until the controller gets a completion notification that the RAM log was synced to flash, and then allocation switches to a second FBL. Both FBLs are stored in controller RAM and in the flash, and the second FBL is created by the controller when a new control sync starts.

Rather than just use the entire pool of free blocks, the use of an FBL assembled from this pool can have advantages. For example, in case of an unplanned shut down (an ungraceful shutdown, or UGSD), the system will need to restore all the blocks that were allocated since last control-syn, in order to restore the data. Restoring block allocations typically involves reading some metadata from all blocks that are candidates for allocation, which can be an involved process. By maintaining an FBL list, which is a short list of blocks that are candidates for allocation, during mount after UGSD the system will only need scan the blocks from the FBL. In the case of 2 FBLs, the system will scan both lists. During mount to restore allocations that were done during control-sync and also allocation that were done after control-sync was done. With two FBLs, this allows for one list to be used during the control-sync itself and another to be used after control-sync is done.

The compiling of the free block lists, and allocation of blocks from an active FBL, can be performed similarly to how this is done in systems using a FBL, such is describe in US patent publication number 2012-0191927, for example. New blocks can be added to an FBL from a pool of available blocks that can contain previously unwritten blocks as well as previously written blocks that have been released. A block is released when it no longer contains valid data, for example, and placed in the pool of available blocks either after or before being erased, depending on the embodiment. The selection of a block for a FBL from the pool of available blocks can be based various criteria, including considerations such as wear leveling, the number of program-erase (P/E) cycles a block has experienced, previous occurrences of error in a block and so on. In addition to remove a block from a FBL in response to it being selected for use, in some embodiments blocks may also be removed in order to be replaced with "better" blocks from the available pool, again based block characteristics such as wear leveling, the number of program-erase (P/E) cycles a block has experienced, previous occurrences of error in a block and so on.

Figure 17A:
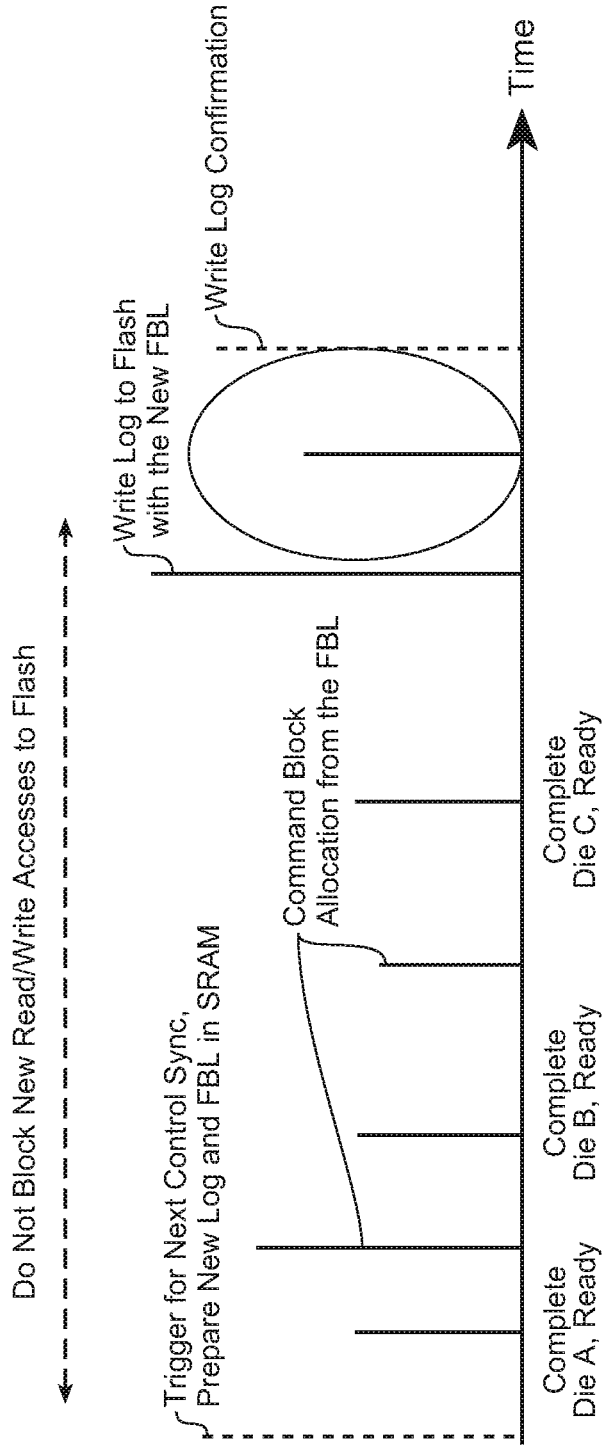
FIGS. 17A and 17B illustrate some of the situations that can lead to the loss of data coherency in a memory system that does not block new blocks are allocated during a control synchronization.
Figure 17B:
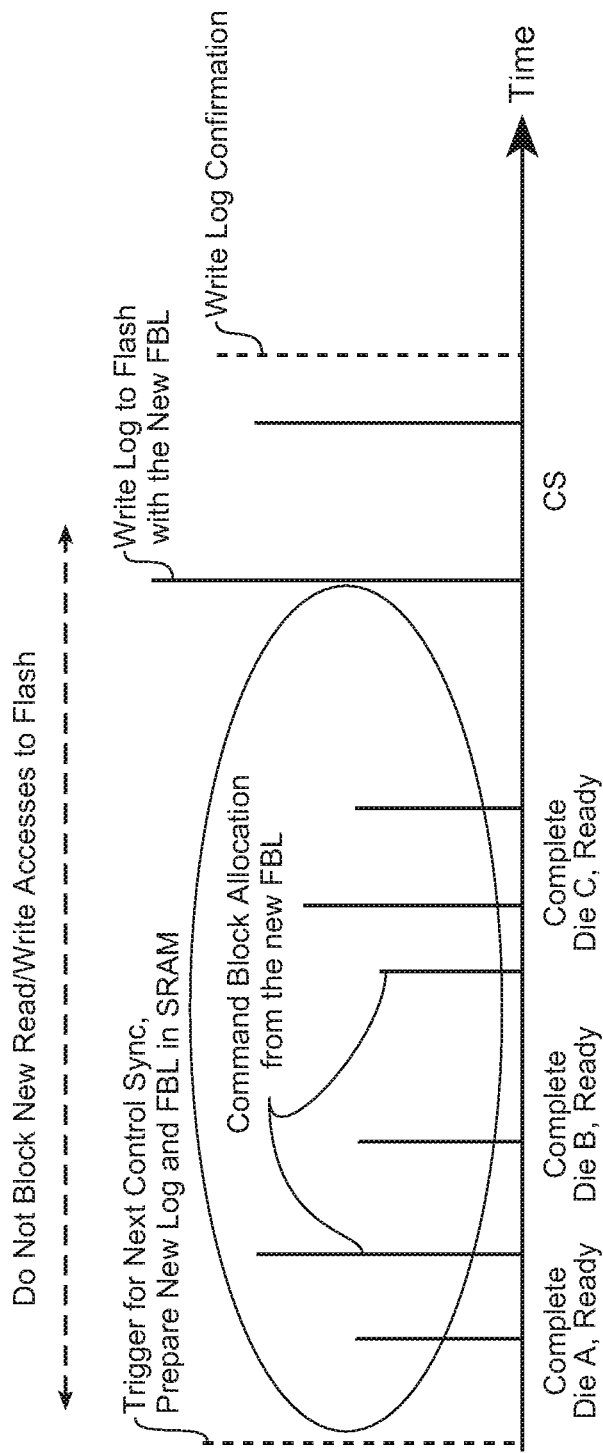

Block allocation in a non-blocking control sync flash transfer layer (FTL) system may be provided by allocating and managing blocks from two free block lists (FBLs) stored in the controller RAM, where a copy of the two FBLs will be stored also in the flash memory and updated every time a non-blocking CS operation is performed. The FTL can be implemented as a firmware module on the controller, such as part of the memory management layer 330 of FIG. 14. FIGS. 17A and 17B can be used to illustrate non-blocking operation and the sort of problem that may occur in a non-blocking CS with only a single FBL.

FIGS. 17A and 17B illustrate a non-blocking arrangement using only a single free block list and are arranged similarly to FIG. 16, beginning with the trigger for next control sync and the preparation of a new log and free block list in the controller. As in FIG. 16, as operations on the different previously allocated dies complete, (here on dies A, B, and C), they indicate their ready status. Unlike FIG. 16, as new read and write accesses to the memory section are not blocked, new blocks can be allocated from the previously assembled free block list in response to new commands, allowing for increased performance.

In FIG. 17A illustrates the situation where, during the control-sync operation, the system is still allocating blocks from the old FBL as held in controller RAM. For an ungraceful shutdown (UGSD), such as from power loss, that occurs between writing of the log to flash memory with the new FBL and writing of the log confirmation, the system will not be able to restore block that were allocated within the ellipse. FIG. 17B illustrates the situation in which the system is allocating blocks from the newly prepared FBL during control-sync operation and a UGSD occurs after the trigger for the next control sync and before writing the log to non-volatile memory. In this case, blocks that the system has allocated from the new FBL may be lost due to a UGSD in the time window represented by the ellipse. More generally, the correct time for the FTL to start allocating blocks from the new FBL is when "write log to flash" happens; however, the FTL layer is not aware of the timing of "write log to flash", but only of the "trigger for next control sync" and "write log confirmation".

The preparation of an updated FBL includes adding new blocks released by memory management operations (such as garbage collection relocations) and removal of blocks from the FBL that were already allocated. A new command allocation from the FBL that occurs after the new updated log was prepared and written to flash will be updated in the controller's RAM tables, but may be lost due to an ungraceful shutdown (UGSD) since after mount (copying of the FBL as stored in non-volatile memory to the controller RAM) the recovery will be made according to the stored log (with ambiguity if it is the updated log or the old log copy). Consequently, the newly allocated block may not be recovered from the new FBL read from flash in case it is the updated FBL that does not include the block allocation performed after it was prepared as shown in FIGS. 17A and 17B.

To allow non-blocking operation without this danger in the event of an ungraceful shutdown, an exemplary embodiment uses two FBLs: a first FBL that includes a list of allocated blocks prior to the current non-blocking CS preparation start; and a second list includes an updated block list that includes blocks that were added or removed as part of the preparations for the next CS. Both FBLs will be written to the log and the flash in the non-blocking CS. In case of mount after an ungraceful shutdown, the two FBLs can be read from the memory section and scanned in order to recover the control information in controller RAM and allowing continuous operation with non-blocking control syncs.

Figure 18:
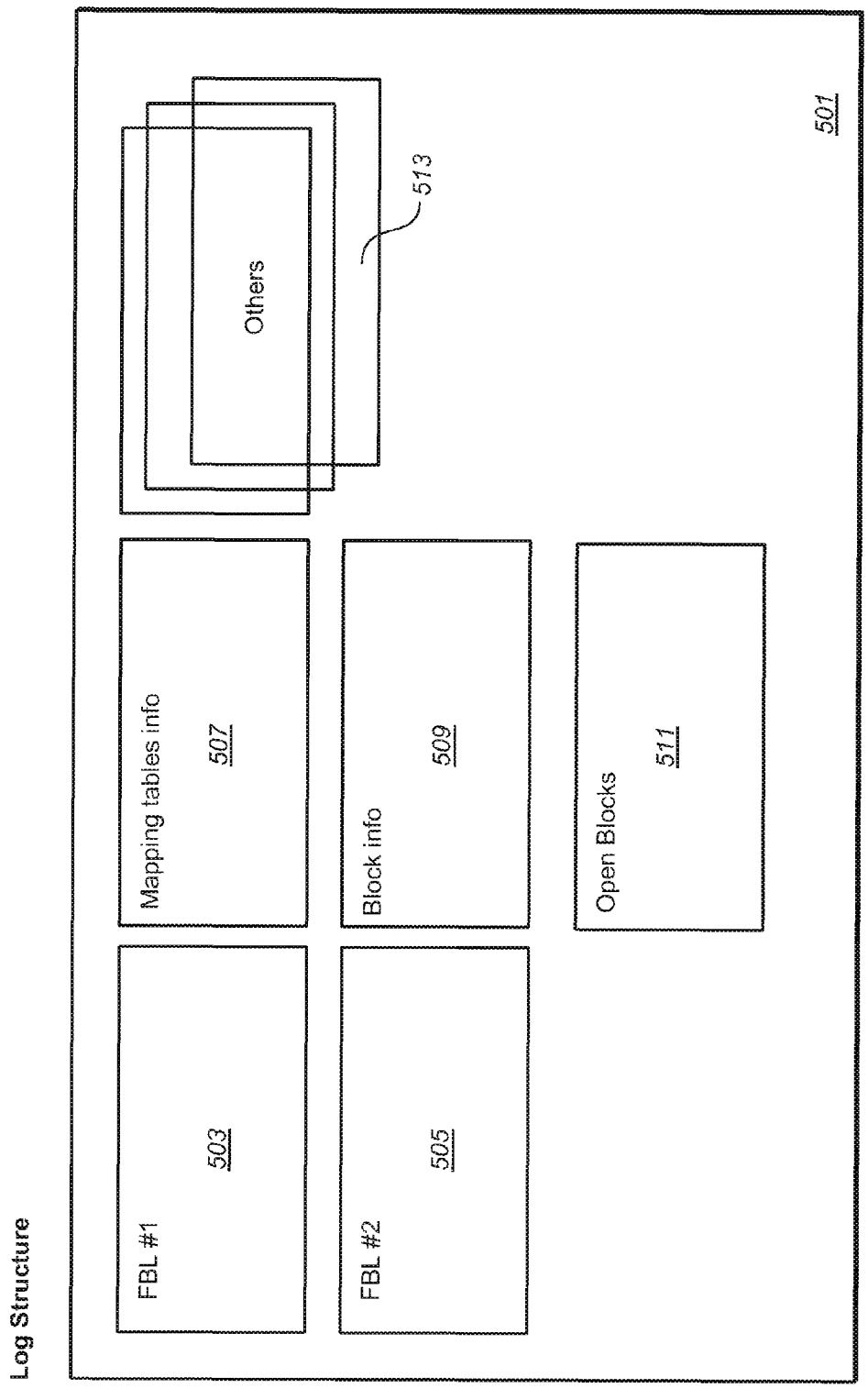
FIG. 18 is a block diagram for an exemplary embodiment of a log structure.

FIG. 18 is a schematic representation for an example of a log structure 501, containing the two free block lists FBL #1 503 and FBL #2 505. The log structure can also include mapping tables information 507 for logical to physical translation, block information 509 (such as experience counts (i.e. program/erase cycles) or measures of block quality, such as errors or defects), a pool of open blocks 511 that are available for the free block lists, and other information 513. Other examples of block and other information can include: statistics counters, a state of each block (allocated/free/reserved-for-exceptions/etc. . . . ), type of block (binary, multistate), list of read-scrub blocks (blocks with high bit error rates), information about additional control blocks in the system, and so on.

Figure 19:
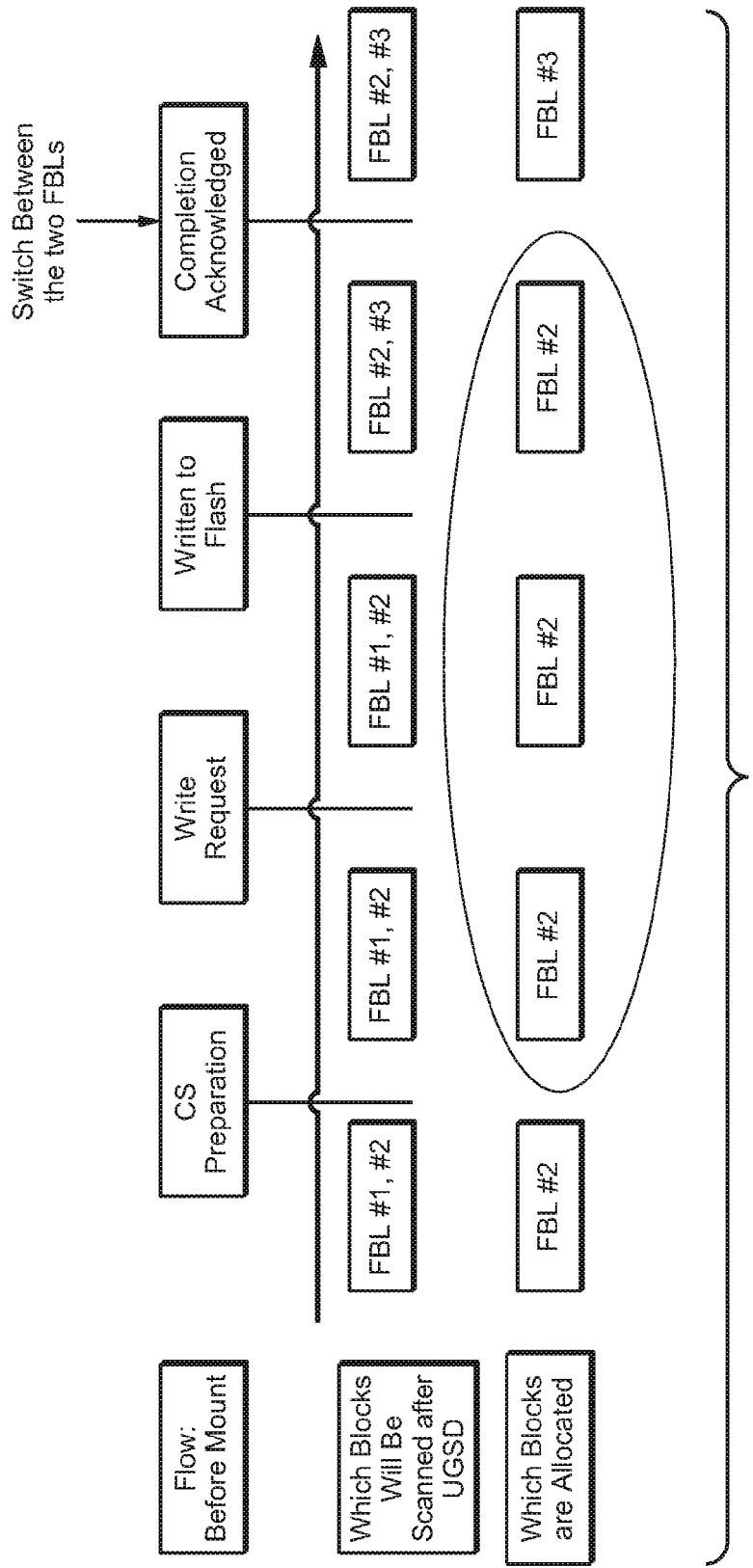
FIG. 19 provides some detail on block management for a non-blocking control sync system using two free block lists.

One exemplary embodiment of a block allocating method can be as follows: when a non-blocking CS operation is prepared by the controller, a new or updated FBL, here labelled FBL#3, is created to replace the previous FBL#1, as illustrated in FIG. 19. The timing diagram of FIG. 19 illustrates the creation of a new FBL, which blocks will be scanned after UGSD and from which new blocks will be allocated from a first FBL (FBL #2) while the newly created FBL (FBL #3) will not be used for block allocations until the control sync ends and a completion is received.

In FIG. 19 the top row shows the flow for a control sync operation; the second row illustrate the FBLs from which blocks are scanned after an UGSD; and the bottom row shows the FBL from which blocks are allocated. As shown in the third row, new blocks will be allocated from FBL#2 before a log write confirmation is received from the die(s), and new block allocations will be made from FBL#3 only after receiving the log write confirmation. The ellipse illustrates the time during the control sync when new block allocations would have otherwise been blocked in a blocking arrangement.

Figure 20C:
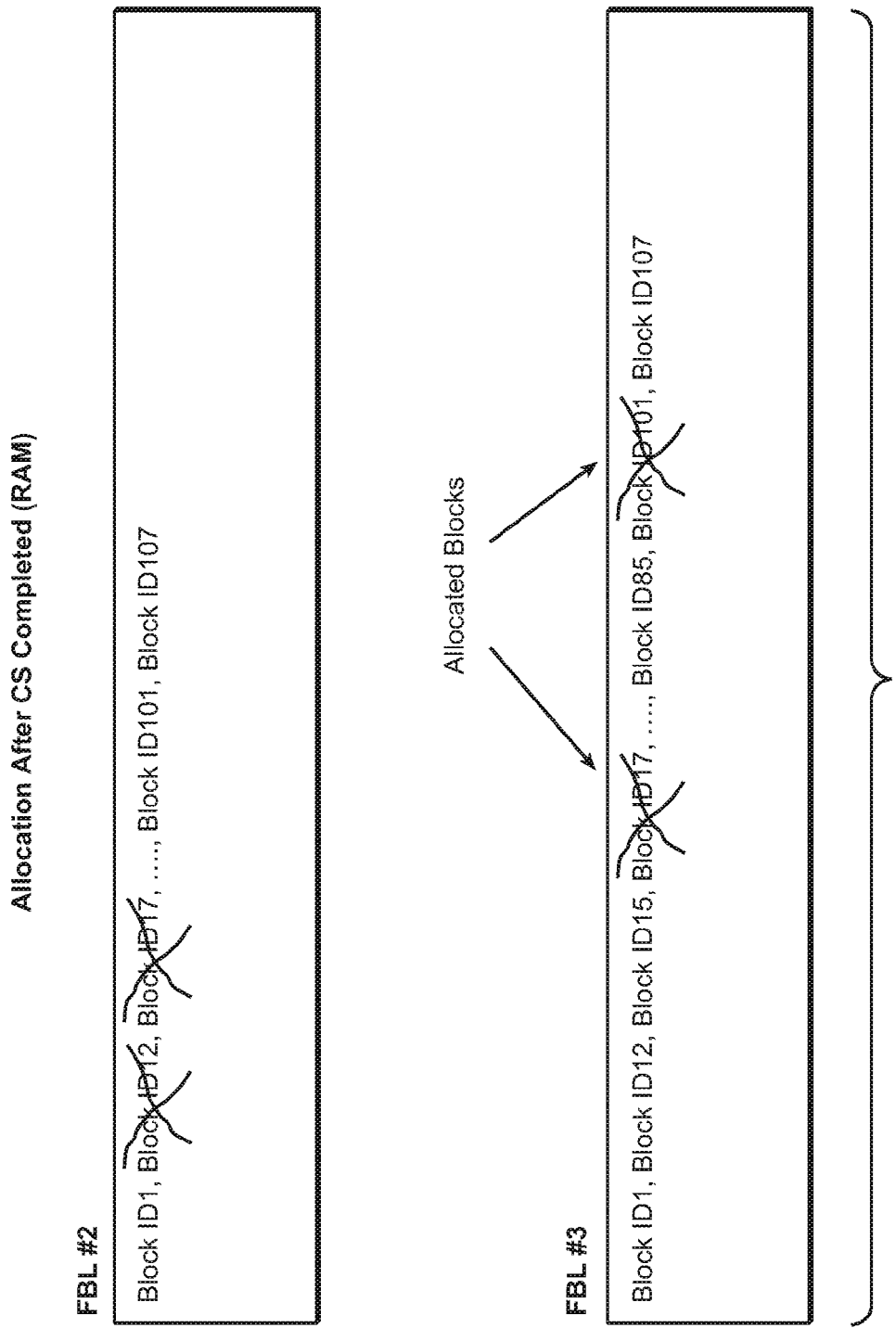

FIGS. 20A-20E illustrate the composition FBL#2 and FBL #3 in the controller's RAM under various circumstances. FIG. 20A shows an example of the lists during control sync preparation. FBL #2 includes a number of blocks (Block ID1, Block ID12, . . . ) available for allocation that can identified by their physical address. FBL #3 can include the same free blocks as in FBL #2, but with blocks that have allocated (such as Block ID12) removed and new free blocks (such as Block ID15, Blocks ID85) added.

FIG. 20B looks at block allocation during a control sync. In this example, blocks have been allocated from FBL #2 (Block ID12, Block ID 17), but these are not removed from FBL #3 during the control sync after these have been prepared. However, new blocks (here Block ID15, Block ID85) can be added.

FIG. 20C shows allocation after control sync. As FBL #2 is prepared, then some blocks can be allocated out of FBL #2 (Block ID12 and Block ID17), with others blocks of FBL #2 left as unassigned remainders. The preparation of FBL #3 can start from the remainders of FBL #2, but blocks can be removed from the list and other blocks may be added to the list. FIG. 20C illustrates Bocks ID 17 and ID 101 being allocated from FBL #3.

FIG. 20D looks at mount after an ungraceful shut down, but before control sync completion. During mount after an ungraceful shut down, the log with the two FBLs (FBL #1 and FBL #2) can be read back from non-volatile memory and blocks that appear in both FBLs can be scanned and the management tables can be restored accordingly, including identifying blocks that were allocated after the last control sync and not removed from the FBL and control-to-data coherency is maintained.

FIG. 20E looks at mount after an ungraceful shut down and after control sync completion. During mount after UGSD, the log with the updated FBLs (FBL #2 and FBL #3) can be read from non-volatile memory and blocks that appear in both FBLs can be scanned. The management table can be restored accord to the scan, including identifying blocks that were allocated after the last control sync and not removed from the FBL and control-to-data coherency is again maintained.

As illustrated by FIGS. 20D and 20E, during mount the two FBLs can be read from flash and scanned to recover the control data in the volatile memory used by the controller. The two FBLs can be FBL#1 and FBL#2 if the log write request was not written to non-volatile memory before the UGSD and the log write completion note was not received; or FBL#2 and FBL#3 if the log write request was completed. Hence, by scanning two FBLs that include both the previous control information before the control sync preparation started and the new control information prepared in the current control sync, the FTL can see that data to control information is coherent and not lost.

Figure 21:
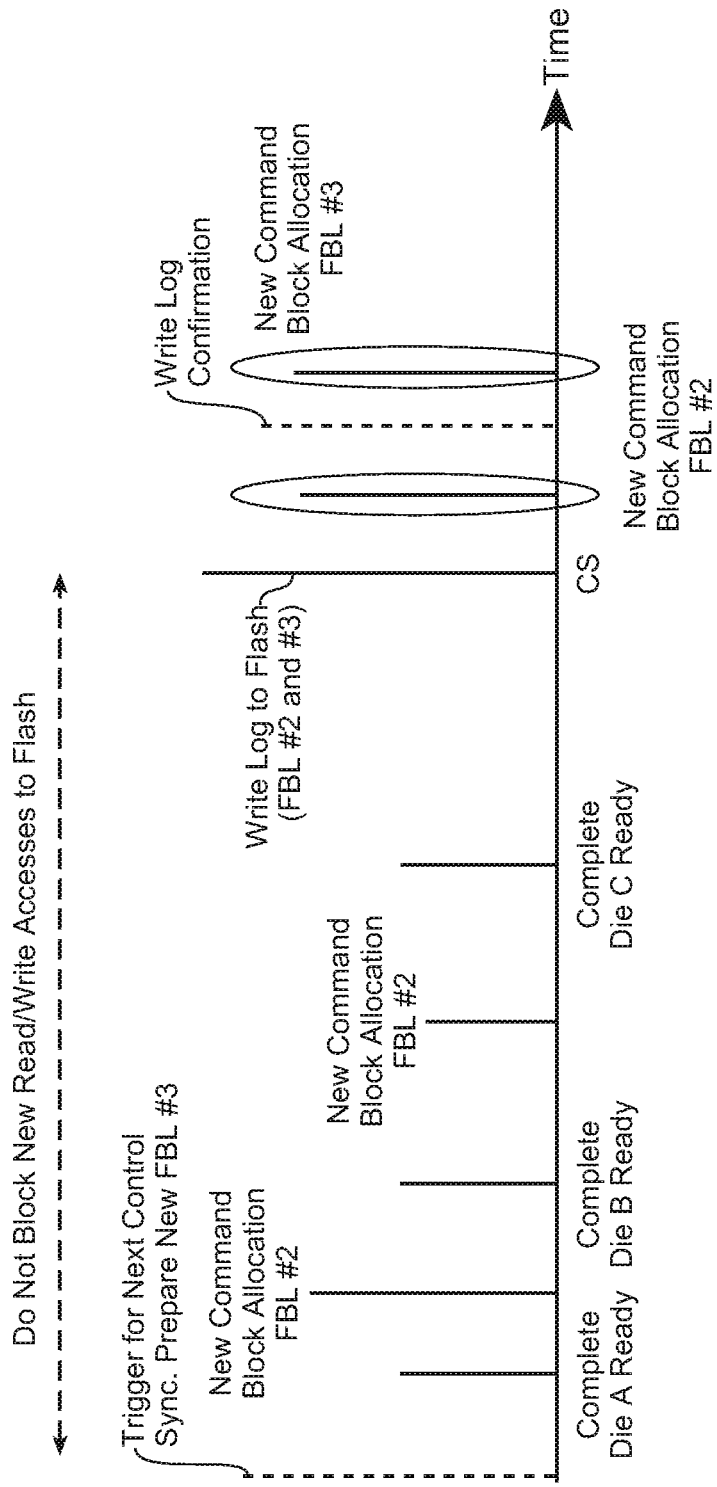
FIG. 21 looks at non-blocking control sync operation when two free block lists are used.

In an alternate set of embodiments, during non-blocking control sync operations, blocks may be allocated from the FBL#2 stored in the controller's RAM, and a smaller list FBL#2' (not shown in the figures) can be updated in the RAM having smaller number of blocks comparing to the original FBL#2. Whenever the controller allocates a new block from an FBL, on the first time that the system writes to the block, whether for embodiments that do or do not use a smaller list, the system can write in the block's metadata an indication that this is new data. For example, this could be written in the first physical page, or smallest read unit, of the block. During mount, the controller can read the metadata of the first read unit of each of the blocks in the two FBL lists and determine if the block was allocated and re-written or not. In this way the system can restore which blocks were allocated since the last control sync operation. Blocks that appeared in FBL#2, but were allocated during the CS operation and do not appear anymore in FBL#2', can still be found and restored in the RAM control tables during mount since they can be read from the control data stored in the non-volatile memory. As shown in FIG. 21, new block allocation from FBL#2 that will not be seen in the FBLs stored on flash after a UGSD.

FIG. 21 further illustrates the exemplary non-blocking control sync with two FBLs, beginning with the trigger for the control sync and the preparation of the new FBL #3. As with the similar figures above, previously allocated operations complete and return a ready status. Prior to writing the log to non-volatile memory for FBL #2 and FBL #3, new command block allocations are made from FBL #2. After writing the log, but before confirmation, allocations are still made from FBL #2. After confirmation, new command block allocations are made from FBL #3.

For any of the variations described above, the use of two free block lists for block allocation allows for non-blocking control sync, while providing coherent flash transfer layer operation without losing control information in the case of an ungraceful shut down. The non-blocking operation improves performance by allowing the system to operate continuously by not halting multi flash die read/write operations during control sync operations.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A method of operating a non-volatile memory system, comprising:
   storing data, including user and control data, in a non-volatile memory circuit having a plurality of non-volatile memory cells formed as a plurality of multi-cell blocks; and
   managing the storage of data on the memory circuit by a controller, the managing comprising:
      maintaining in volatile memory of two or more free block lists, the two or more free block lists being formed of blocks available for the writing of data;
      maintaining copies of the two of more free block lists in the non-volatile memory;
      allocating blocks from a first free block list of the two or more free block lists;
      while allocating the blocks from the first free block list, performing a synchronizing operation for a second free block list of the two or more free block lists, the synchronizing operation comprising:
         updating the second free block list; and
         preparing control data related to the updating of the second free block list; and
      allocating blocks from the updated second free block list and discontinuing allocating the blocks from the first free block list after the synchronizing operation is completed.

2. The method of claim 1, further comprising:
   receiving a notification that the synchronizing operation for the second free block list is completed;
   storing the control data related to the updating of the second free block list in the non-volatile memory; and
   in response to the notification, allocating the blocks from the updated second free block list.

3. The method of claim 1, wherein updating the second free block list comprises:
   adding one or more blocks without valid data; and
   removing the blocks allocated from the first free block list.

4. The method of claim 3, wherein adding the one or more blocks without valid data comprises:
   selecting blocks from a pool of available blocks including previously allocated, but subsequently released blocks.

5. The method of claim 4, wherein updating the second free block list comprises:
   replacing the one or more blocks with a corresponding number of one or more blocks from the pool of available blocks based on characteristics of the one or more blocks being replaced and the one or more blocks from the pool of available blocks used as replacements.

6. The method of claim 1, wherein the two or more free block lists are allowed to have common elements.

7. The method of claim 1, further comprising:
   during an initialization process, reestablishing the two or more free block lists maintained in the volatile memory from the copies of the two or more free block lists from the non-volatile memory into the volatile memory.

8. The method of claim 1, wherein the managing is implemented as firmware executed by the controller.

9. The method of claim 1, wherein the non-volatile memory circuit is a monolithic three-dimensional semiconductor memory device in which the memory cells are arranged in multiple physical levels above a silicon substrate and comprise a charge storage medium.

10. A controller for a non-volatile memory system, comprising:
    a volatile memory;
    logic circuitry configured to manage the storage of data on a non-volatile memory circuit having a plurality of non-volatile memory cells formed as a plurality of multi-cell blocks, wherein managing of the storage of data on the non-volatile memory circuit comprises:
       maintaining in volatile memory of two or more free block lists, the two or more free block lists being formed of blocks available for the writing of data;
       maintaining copies of the two or more free block lists in the non-volatile memory;
       allocating blocks from a first free block list of the two or more free block lists;
       while allocating the blocks from the first free block list, performing a synchronizing operation for a second free block list of the two or more free block lists, the synchronizing operation comprising:
          updating the second free block list; and
          preparing control data related to the updating of the second free block list; and
       allocating blocks from the updated second free block list and discontinuing allocating the blocks from the first free block list after the synchronizing operation is completed.

11. The controller of claim 10, the managing further comprising:
    receiving a notification that the synchronizing operation for the second free block list is completed;

storing the control data related to the updating of the second free block list in the non-volatile memory; and in response to the notification, allocating the blocks from the updated second free block list.

12. The controller of claim 10, wherein updating the second free block list comprises:
adding one or more blocks without valid data; and
removing the blocks allocated from the first free block list.

13. The controller of claim 10, wherein during an initialization process, the logic circuitry reestablishes the two or more free block lists maintained in the volatile memory from the copies of the two or more free block lists from the non-volatile memory into the volatile memory.

14. The controller of claim 10, wherein the managing is implemented as firmware executed by the controller.

15. The controller of claim 10, wherein the non-volatile memory circuit is a monolithic three-dimensional semiconductor memory device in which the memory cells are arranged in multiple physical levels above a silicon substrate and comprise a charge storage medium.

16. A non-volatile memory system, comprising:
a non-volatile memory circuit having a plurality of non-volatile memory cells formed as a plurality of multi-cell blocks; and
a controller, including:
a volatile memory;
logic circuitry configured to manage the storage of data on a non-volatile memory circuit having a plurality of non-volatile memory cells formed as a plurality of multi-cell blocks, wherein managing of the storage of data on the non-volatile memory circuit includes:
maintaining in volatile memory of two or more free block lists, the two or more free block lists being formed of blocks available for the writing of data;
maintaining copies of the two or more block lists in the non-volatile memory;
allocating blocks from a first free block list of the two or more free block lists;
while allocating the blocks from the first free block list, performing a synchronizing operation for a second free block list of the two or more free block lists, the synchronizing operation including:
updating the second free block list; and
preparing control data related to the updating of the second free block list and
allocating blocks from the updated second free block list and discontinuing allocating the blocks from the first free block list after the synchronizing operation is completed.

17. The non-volatile memory system of claim 16, the managing further comprising:
receiving a notification that the synchronizing operation for the second free block list is completed;
storing the control data related to the updating of the second free block list in the non-volatile memory; and
in response to the notification, allocating the blocks from the updated second free block list.

18. The non-volatile memory system of claim 16, wherein updating the second free block list comprises:
adding one or more blocks without valid data; and
removing the blocks allocated from the first free block list.

19. The non-volatile memory system of claim 16, wherein during an initialization process, the logic circuitry reestablishes the two or more free block lists maintained in the volatile memory from the copies of the two or more free block lists from the non-volatile memory into the volatile memory.

20. The non-volatile memory system of claim 16, wherein the managing is implemented as firmware executed by the controller.

21. The non-volatile memory system of claim 16, wherein the non-volatile memory circuit is a monolithic three-dimensional semiconductor memory device in which the memory cells are arranged in multiple physical levels above a silicon substrate and comprise a charge storage medium.

* * * * *